(12) United States Patent
Phung et al.

(10) Patent No.: US 12,108,689 B2
(45) Date of Patent: Oct. 1, 2024

(54) TRIMMABLE INDUCTORS FOR QUBIT FREQUENCY TUNING

(71) Applicant: International Business Machines Corporation, Armonk, NY (US)

(72) Inventors: Timothy Phung, Milpitas, CA (US); Charles Thomas Rettner, San Jose, CA (US); Harry Jonathon Mamin, Palo Alto, CA (US); Vivekananda P. Adiga, Ossining, NY (US); Russell A. Budd, North Salem, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 727 days.

(21) Appl. No.: 17/200,487

(22) Filed: Mar. 12, 2021

(65) Prior Publication Data
US 2022/0293845 A1    Sep. 15, 2022

(51) Int. Cl.
*H10N 60/12*    (2023.01)
*H01L 49/02*    (2006.01)
(Continued)

(52) U.S. Cl.
CPC ............ *H10N 60/12* (2023.02); *H01L 28/10* (2013.01); *H01L 28/40* (2013.01); *H10N 60/0912* (2023.02); *H10N 69/00* (2023.02)

(58) Field of Classification Search
CPC ......... H10N 60/12–126; H10N 60/805; H10N 60/0912–0941; H01L 28/10; H01L 28/40–92
See application file for complete search history.

(56) References Cited

U.S. PATENT DOCUMENTS 6,157,329 A * 12/2000 Lee ................. H03M 3/408
                                                        341/143
7,085,121 B2    8/2006 Lynch et al.
(Continued)

FOREIGN PATENT DOCUMENTS

EP        0063887        11/1982

OTHER PUBLICATIONS

Dayton et al., "Experimental Demonstration of a Josephson Magnetic Memory Cell with a Programmable m-Junction," https://arxiv.org/pdf/1711.01681.pdf, 2018, 5 pages.

*Primary Examiner* — Aaron J Gray
(74) *Attorney, Agent, or Firm* — Amin, Turocy & Watson, LLP

(57) ABSTRACT

Systems and techniques that facilitate trimmable inductors for qubit frequency tuning are provided. In various embodiments, a device can comprise a Josephson junction. In various aspects, the Josephson junction can be shunted by a capacitor, and a trimmable inductor can couple the Josephson junction to a pad of the capacitor. In various cases, the trimmable inductor can comprise a first conductive path that includes a severable and/or weldable superconducting bridge and a second conductive path that is in parallel with the first conductive path. In various aspects, severing and/or welding the severable and/or weldable superconducting bridge can controllably change an inductance of the trimmable inductor, which can commensurately change a resonant frequency of a qubit formed by the Josephson junction and the capacitor.

8 Claims, 27 Drawing Sheets

(51) Int. Cl.
*H10N 60/01* (2023.01)
*H10N 69/00* (2023.01)

(56) References Cited

U.S. PATENT DOCUMENTS

| | | |
|---|---|---|
| 7,369,010 B2 | 5/2008 | Alvarez et al. |
| 8,781,542 B2 | 7/2014 | Tsukamoto et al. |
| 8,837,544 B2 | 9/2014 | Santori et al. |
| 9,344,092 B2 | 5/2016 | Abraham et al. |
| 9,728,837 B2 | 8/2017 | Pagani et al. |
| 10,164,606 B1 | 12/2018 | Keane et al. |
| 10,540,603 B2 | 1/2020 | Naaman et al. |
| 10,693,566 B2 | 6/2020 | Silwa et al. |
| 2017/0201224 A1* | 7/2017 | Strong .................. H03H 7/185 |
| 2017/0286859 A1 | 10/2017 | Harris et al. |
| 2019/0371518 A1* | 12/2019 | Viala .................. H01F 27/2804 |
| 2021/0201188 A1* | 7/2021 | Yamaji .................. H10N 60/82 |

* cited by examiner

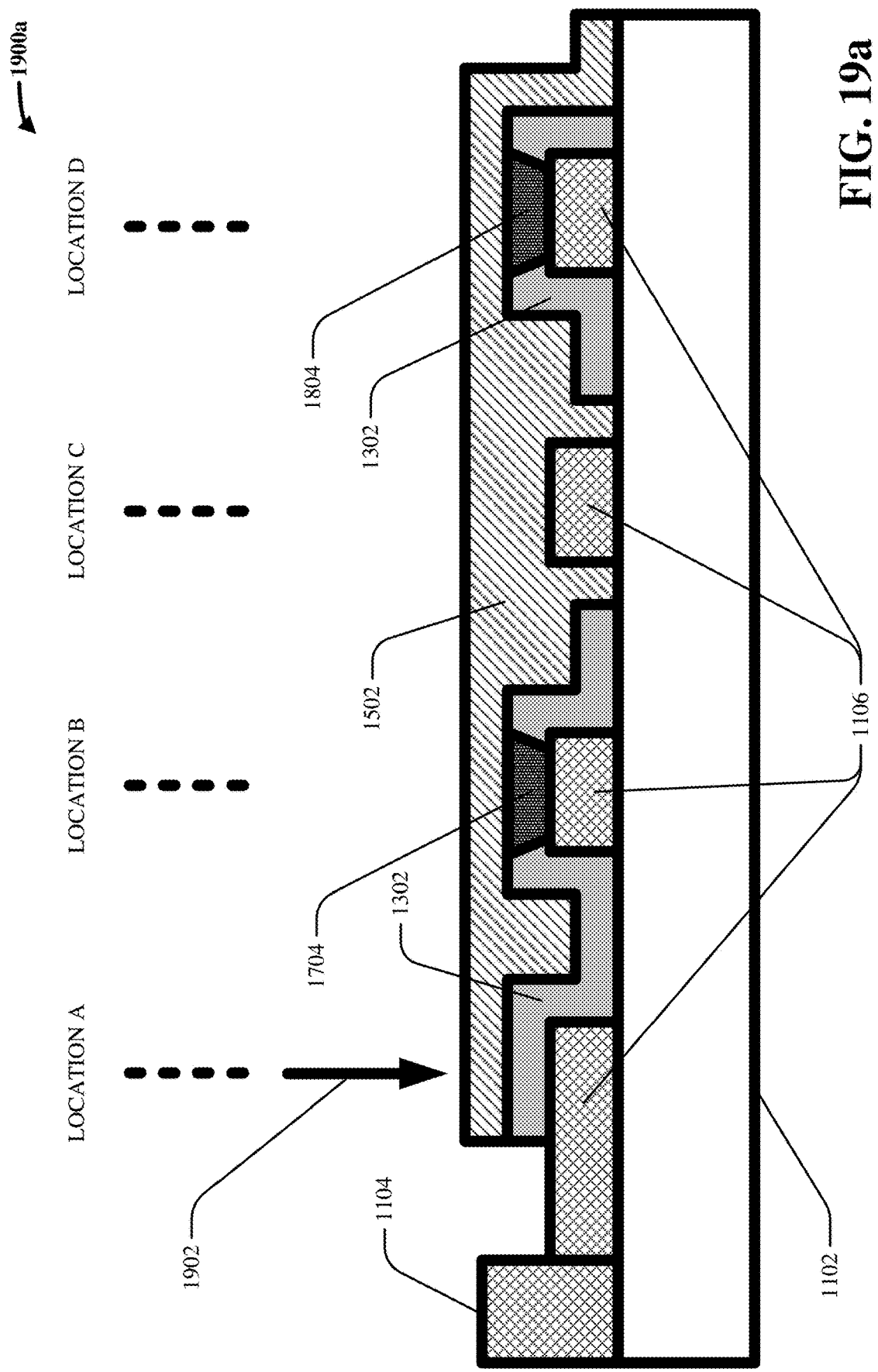

TRIMMABLE INDUCTORS FOR QUBIT FREQUENCY TUNING

BACKGROUND

The subject disclosure relates to qubit frequency tuning, and more specifically to trimmable inductors for qubit frequency tuning.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus and/or computer program products that facilitate trimmable inductors for qubit frequency tuning are described.

According to one or more embodiments, a device is provided. In various embodiments, the device can comprise a Josephson junction. In various aspects, the Josephson junction can be shunted by a capacitor. In various instances, a trimmable inductor can couple the Josephson junction to a pad of the capacitor. In various cases, the trimmable inductor can comprise a first conductive path that includes a severable superconducting bridge and a second conductive path that is in parallel with the first conductive path. In various aspects, severing the severable superconducting bridge can increase an inductance of the trimmable inductor, which can decrease a resonant frequency of a qubit formed by the Josephson junction and the capacitor. In various cases, the trimmable inductor can comprise a first conductive path that includes a weldable superconducting bridge and a second conductive path that is in parallel with the first conductive path. In various aspects, welding the weldable superconducting bridge can decrease an inductance of the trimmable inductor, which can increase a resonant frequency of a qubit formed by the Josephson junction and the capacitor.

According to one or more embodiments, manufacturing and/or fabrication processes can be implemented to create one or more of the above devices.

DESCRIPTION OF THE DRAWINGS

FIGS. 11-19b illustrate block diagrams of an example, non-limiting stepwise-trimmable inductor including diffusion-based antifuses in accordance with one or more embodiments described herein.

DETAILED DESCRIPTION

Figure 1:
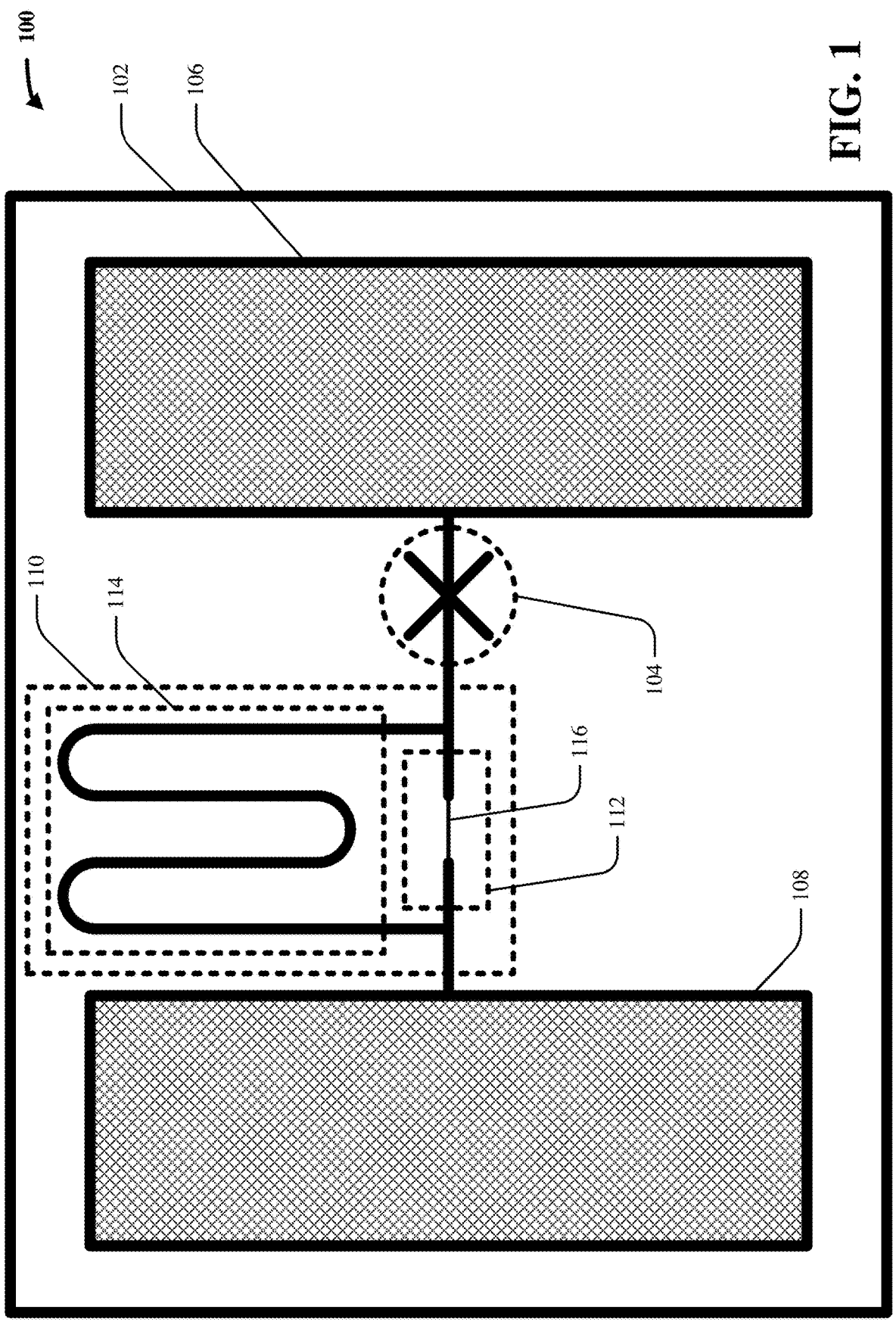
FIG. 1 illustrates a block diagram of an example, non-limiting device that facilitates trimmable inductors for qubit frequency tuning in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

A superconducting quantum computing system can comprise one or more superconducting qubits (e.g., transmon qubits, charge qubits, flux qubits) that are fabricated/manufactured on quantum chips/wafers. The overall operation/performance of the superconducting quantum computing system can depend upon the resonant frequencies (e.g., operational frequencies) of the one or more superconducting qubits. In other words, if the actual resonant frequencies differ from desired/target values by more than a threshold margin, frequency collisions between neighboring qubits on the quantum chips/wafers can result, which can impede proper operation of the superconducting quantum computing system. Thus, systems and/or techniques for facilitating quick and/or accurate post-fabrication tuning of the resonant frequency of a superconducting qubit can be desirable.

Various embodiments of the invention can address one or more of these technical problems. Specifically, various embodiments of the invention can provide for trimmable superconducting inductors that can be readily trimmed during post-fabrication processing. As described herein, such trimming can alter (e.g., increase and/or decrease) the resonant frequency of an associated superconducting qubit. Thus, in various aspects, the resonant frequency of an already-fabricated superconducting qubit can be tuned to a desired/target value by selectively and/or controllably trimming a trimmable superconducting inductor that is associated with the superconducting qubit.

In various embodiments, a superconducting qubit can comprise a Josephson junction (e.g., and/or multiple Josephson junctions) shunted by a planar capacitor (e.g., and/or multiple planar capacitors), such as a transmon qubit (e.g., in some cases, a transmon qubit can be a planar qubit with a ratio of Josephson energy to charging energy that is greater than 30). In various aspects, the superconducting qubit can have a resonant frequency (also referred to as "operational frequency") that is a function of the resistance of the Josephson junction, the overall and/or equivalent capacitance shunted by the Josephson junction, and/or the overall and/or equivalent inductance in series with the Josephson junction. Thus, in various aspects, the resonant frequency of the superconducting qubit can be altered by altering the overall and/or equivalent inductance of the superconducting qubit.

In various instances, the overall and/or equivalent inductance of the superconducting qubit can be a function of an inductance associated with the superconducting wires that couple the Josephson junction to the planar capacitor. Specifically, in various cases, the planar capacitor can comprise two or more pads that are connected, coupled, and/or bridged by Josephson junctions. In various aspects, the Josephson junctions can be coupled/connected to the two or more pads via any suitable superconducting wires. In various cases, the inductance of the superconducting wires can be a function of the geometry (e.g., size, shape, dimensions, layout) of the superconducting wires and/or of the topology of the superconducting wires (e.g., whether the superconducting wires are coiled/spiraled, whether the superconducting wires are structured in series and/or in parallel). Thus, in various aspects, controllably altering the geometry and/or topology of the superconducting wires can controllably alter the resonant frequency of the superconducting qubit. In various cases, trimmable inductors as described herein can be implemented so as to controllably alter the inductance of the superconducting wires, thereby controllably altering the resonant frequency of the superconducting qubit.

In various embodiments, a trimmable inductor can be coupled in series between the Josephson junction and a pad of the planar capacitor. That is, the planar capacitor can comprise two or more pads (e.g., metal plates), and a trimmable inductor as described herein can physically and/or electrically link the Josephson junction to at least one of the two or more pads.

In various aspects, the trimmable inductor can comprise a first conductive path and a second conductive path that is in parallel with the first conductive path. In various cases, the first conductive path can be formed by any suitable superconducting wire which includes a severable and/or weldable superconducting bridge. In various instances, the second conductive path can be formed by any suitable superconducting wire which is coiled, spiraled, and/or meandered so as to exhibit some non-negligible inductance (e.g., an inductance value that is above any suitable threshold/margin). In some cases, the superconducting wire of the first conductive path can be not coiled, not spiraled, and/or not meandered (e.g., and/or less coiled, less spiraled, less meandered), such that the first conductive path exhibits an inductance that is lower than the inductance of the second conductive path. In other cases, however, the first conductive path can be more coiled, more spiraled, and/or more meandered than the second conductive path, such that the first conductive path exhibits an inductance that is higher than the inductance of the second conductive path. In various instances, the second conductive path can lack a severable and/or weldable superconducting bridge.

In some cases, if the first conductive path comprises a severable superconducting bridge, the Josephson junction can be electrically coupled/connected to the at least one pad by both the first conductive path and the second conductive path when the severable superconducting bridge is unsevered. In other words, because the first conductive path and the second conductive path can be in parallel, both the first conductive path and the second conductive path can be considered as closed electrical connections between Josephson junction and the at least one pad when the first conductive path comprises a severable superconducting bridge that has not yet been severed. In such case, the overall/equivalent inductance of the trimmable inductor can be considered as equal to the reciprocal of the sum of the reciprocals of the inductance of the first conductive path and the inductance of the second conductive path (e.g., inductances in series add together, inductances in parallel add via reciprocating the sum of their reciprocals). Accordingly, the overall/equivalent inductance of the trimmable inductor can be less than both the inductances of first conductive path and the second conductive path when the severable superconducting bridge is unsevered.

In various aspects, severing (e.g., via laser melting/ablating, via etching, via scribing, via heating) the severable superconducting bridge can cause the first conductive path to switch from an electrically-closed state (e.g., allowing the flow of current) to an electrically-open state (e.g., not allowing the flow of current). Accordingly, after severing, the Josephson junction can be electrically coupled/connected to the at least one pad by the second conductive path but not by the first conductive path. In such case, the overall/equivalent inductance of the trimmable inductor can now be considered as equal to the inductance of the second conductive path (e.g., if the severable superconducting bridge of the first conductive path is severed/trimmed, the first conductive path can no longer inductively affect the Josephson junction). Moreover, the inductance of the second conductive path can be greater than the reciprocal of the sum of the reciprocals of the inductances of the first conductive path (pre-severing) and the second conductive path. So, severing the severable superconducting bridge of the first conductive path can be considered as increasing the overall/equivalent inductance of the trimmable inductor. This can correspondingly decrease the resonant frequency of the superconducting qubit formed by the Josephson junction and the planar capacitor. In various instances, the magnitude of the decrease in the resonant frequency can depend upon the sizes, shapes, dimensions, layouts, materials, and/or coils/spirals of the superconducting wires that make up the first conductive path and the second conductive path.

In some cases, if the first conductive path comprises a weldable superconducting bridge, the Josephson junction can be electrically coupled/connected to the at least one pad by the second conductive path and not by the first conductive path when the weldable superconducting bridge is unwelded. In other words, although the first conductive path and the second conductive path can be in parallel, the first conductive path can be considered being in an electrically-open state when the weldable superconducting bridge has not yet been welded. In such case, the overall/equivalent inductance of the trimmable inductor can be considered as equal to the inductance of the second conductive path alone.

In various aspects, welding (e.g., via laser melting/ablating, via etching, via scribing, via heating) the weldable superconducting bridge can cause the first conductive path to switch from an electrically-open state to an electrically-closed state. Accordingly, after welding, the Josephson junction can be electrically coupled/connected to the at least one pad by both the first conductive path and the second conductive path. In such case, the overall/equivalent inductance of the trimmable inductor can now be considered as equal to the reciprocal of the sum of the reciprocals of the inductance of the first conductive path and the inductance of the second conductive path, such that the overall/equivalent inductance is now less than the individual inductances of the first conductive path and the second conductive path. So, welding the weldable superconducting bridge of the first conductive path can be considered as decreasing the overall/equivalent inductance of the trimmable inductor. This can correspondingly increase the resonant frequency of the superconducting qubit formed by the Josephson junction and the planar capacitor. In various instances, the magnitude of the increase in the resonant frequency can depend upon the sizes, shapes, dimensions, materials, and/or coils/spirals of the superconducting wires that make up the first conductive path and the second conductive path.

In other words, various embodiments of the invention can include superconducting qubit devices that are pre-fabricated and/or pre-manufactured with trimmable inductors, and such trimmable inductors can be easily trimmed during post-fabrication processing to control resonant frequencies as desired. That is, various embodiments of the invention constitute novel quantum chip structures/architectures that allow for the easy post-fabrication modulation of inductances of superconducting qubits, thereby allowing commensurately easy post-fabrication tuning of resonant frequencies.

Various embodiments of the invention can be employed to use hardware and/or software to solve problems that are highly technical in nature (e.g., to facilitate trimmable inductors for qubit frequency tuning), that are not abstract and that cannot be performed as a set of mental acts by a human. Indeed, various embodiments of the invention can constitute real-world, physical quantum structures/devices (e.g., superconducting inductor architectures) that can be fabricated on a real-world substrate (e.g., silicon chip/wafer) in order to facilitate easy tuning of resonant frequencies during post-fabrication processing (e.g., in some cases, embodiments of the invention can be implemented post flip-chip bonding and/or post full chip packaging, without requiring debonding). Such real-world, physical quantum devices/architectures certainly are not abstract, are not laws of nature, and are not natural phenomena.

Moreover, various embodiments of the invention can integrate into a practical application the teachings disclosed herein. Indeed, in various embodiments, the disclosed teachings can facilitate the fabrication of a quantum device having superconducting inductors, where such superconducting inductors are readily trimmable during post-fabrication processing, and where controllably trimming (e.g., severing and/or welding) such superconducting inductors can correspondingly control a resonant frequency of an associated superconducting qubit on the quantum device without adversely affecting coherence and/or performance of the quantum device. Conventional techniques simply cannot facilitate such tuning of quantum resonant frequencies in a post-fabrication setting. Thus, embodiments of the invention constitute a concrete and tangible technical improvement in the field of quantum frequency tuning.

It should be appreciated that the figures and/or drawings accompanying this disclosure are non-limiting examples and are not necessarily drawn to scale.

FIG. 1 illustrates a block diagram of an example, non-limiting device 100 that can facilitate trimmable inductors for qubit frequency tuning in accordance with one or more embodiments described herein.

As shown, the device 100 can comprise a substrate 102. In various aspects, the substrate 102 can comprise any suitable chip/wafer material that can be used in quantum computing (e.g., silicon substrate). In various cases, the substrate 102 can comprise any suitable size, shape, and/or dimensions. In various aspects, a Josephson junction 104 can be formed on the substrate 102. In various aspects, the Josephson junction 104 can comprise any suitable construction and/or composition (e.g., two or more superconducting layers that sandwich a weak link, such as an oxide layer). In various aspects, the Josephson junction 104 can comprise any suitable size, shape, and/or dimensions. In various instances, the Josephson junction 104 can be coupled to a pad 106 and to a pad 108. In various aspects, the pad 106 and the pad 108 can comprise any suitable superconducting materials (e.g., can comprise the same and/or different materials as each other), and/or can comprise any suitable sizes, shapes, and/or dimensions (e.g., can comprise the same and/or different dimensions as each other). In various embodiments, the pad 106 and the pad 108 can be considered as collectively forming a planar capacitor that shunts the Josephson junction 104. Thus, in various aspects, the Josephson junction 104, the pad 106, and the pad 108 can together be considered as a transmon qubit.

In various embodiments, as shown, the Josephson junction 104 can be coupled and/or connected to the pad 108 by a trimmable inductor 110. As mentioned above, the trimmable inductor 110 can be easily trimmed and/or altered during post-fabrication processing to tune the resonant frequency of the transmon qubit formed by the Josephson junction 104, the pad 106, and the pad 108.

In various aspects, the trimmable inductor 110 can comprise a first conductive path 112 and a second conductive path 114. As shown, the first conductive path 112 can be in parallel with the second conductive path 114. In other words, the Josephson junction 104 can be coupled/connected to the pad 108 by both the first conductive path 112 and the second conductive path 114. In various cases, as depicted, the second conductive path 114 can be formed by any suitable superconducting wire (e.g., niobium wire) that is coiled, spiraled, and/or meandered in any suitable fashion, and/or the first conductive path 112 can be formed by any suitable superconducting wire (e.g., same as and/or different from the material of the second conductive path 114) that is not coiled, not spiraled, and/or not meandered. In various instances, this can cause an inductance of the first conductive path 112 to be lower than an inductance of the second conductive path 114. However, those having ordinary skill in the art will appreciate that this is a mere non-limiting example. In various cases, the first conductive path 112 can be coiled, spiraled, and/or meandered and/or the second conductive path 114 can be not coiled, not spiraled, and/or not meandered, such that the inductance of the first conductive path 112 is higher than the inductance of the second conductive path 114. In any case, the first conductive path 112 and/or the second conductive path 114 can be structured so as to exhibit any suitable inductance values.

In various embodiments, the first conductive path 112 can comprise a superconducting bridge 116. In various aspects, the superconducting bridge 116 can be a severable superconducting bridge (e.g., a superconducting fuse) and/or can be a weldable superconducting bridge (e.g., a superconducting antifuse).

Suppose that the superconducting bridge 116 is severable. In such case, the superconducting bridge 116 can be structured so that the first conductive path 112 is initially in an electrically-closed state. In other words, if the superconducting bridge 116 is severable, electric current can flow across the first conductive path 112 when the superconducting bridge 116 is unsevered. Thus, severing (e.g., via laser melting/ablating, via etching, via scribing, via heating) the superconducting bridge 116 can cause the first conductive path 112 to switch from an electrically-closed state to an electrically-open state. That is, if the superconducting bridge 116 is severable, electric current cannot flow across the first conductive path 112 when the superconducting bridge 116 is severed. In various cases, because the second conductive path 114 can lack superconducting bridges, the second conductive path 114 can be considered as being in a permanently electrically-closed state (e.g., electric current can flow across the second conductive path 114 both before and after severing the superconducting bridge 116). Thus, when the superconducting bridge 116 is severable, the trimmable inductor 110 can provide two electrical paths (e.g., 112 and 114) between the Josephson junction 104 and the pad 108 prior to severing of the superconducting bridge 116, and the trimmable inductor 110 can provide one electrical path (e.g., 114) between the Josephson junction 104 and the pad 108 after severing of the superconducting bridge 116. In various cases, such severing can cause the trimmable inductor 110 to switch from providing two inductances in parallel between the Josephson junction 104 and the pad 108 to providing only one inductance between the Josephson junction 104 and the pad 108. This can increase the overall and/or equivalent inductance of the trimmable inductor 110 (e.g., inductances in parallel can diminish each other by the rule of reciprocating the sum of the reciprocals), which can correspondingly decrease the resonant frequency of the transmon qubit formed by the Josephson junction 104, the pad 106, and the pad 108.

Suppose that the superconducting bridge 116 is instead weldable. In such case, the superconducting bridge 116 can be structured so that the first conductive path 112 is initially in an electrically-open state. In other words, if the superconducting bridge 116 is weldable, electric current cannot flow across the first conductive path 112 when the superconducting bridge 116 is unwelded. Thus, welding (e.g., via laser melting/ablating, via etching, via scribing, via heating) the superconducting bridge 116 can cause the first conductive path 112 to switch from an electrically-open state to an electrically-closed state. That is, if the superconducting bridge 116 is weldable, electric current can flow across the first conductive path 112 when the superconducting bridge 116 is welded. As mentioned above, because the second conductive path 114 can lack superconducting bridges, the second conductive path 114 can be considered as being in a permanently electrically-closed state (e.g., electric current can flow across the second conductive path 114 both before and after welding the superconducting bridge 116). Thus, when the superconducting bridge 116 is weldable, the trimmable inductor 110 can provide one electrical path (e.g., 114) between the Josephson junction 104 and the pad 108 prior to welding of the superconducting bridge 116, and the trimmable inductor 110 can provide two electrical paths (e.g., 112 and 114) between the Josephson junction 104 and the pad 108 after welding of the superconducting bridge 116. In various cases, such welding can cause the trimmable inductor 110 to switch from providing only one inductance between the Josephson junction 104 and the pad 108 to providing two inductances in parallel between the Josephson junction 104 and the pad 108. This can decrease the overall and/or equivalent inductance of the trimmable inductor 110 (e.g., inductances in parallel can diminish each other by the rule of reciprocating the sum of the reciprocals), which can correspondingly increase the resonant frequency of the transmon qubit formed by the Josephson junction 104, the pad 106, and the pad 108.

In this way, the inductance of the trimmable inductor 110 (and thus the resonant frequency of the transmon qubit formed by the Josephson junction 104, the pad 106, and the pad 108) can be controlled by severing and/or welding the superconducting bridge 116 during post-fabrication processing. In various cases, the inductance can be increased (and the resonant frequency can thus be decreased) by severing the superconducting bridge 116. In various cases, the inductance can be decreased (and the resonant frequency can thus be increased) by welding the superconducting bridge 116. In various aspects, the magnitude of the change in resonant frequency can depend upon the sizes, shapes, layouts, and/or materials of the first conductive path 112 and/or the second conductive path 114. Therefore, in various aspects, selective/controlled trimming of the trimmable inductor 110 as described herein allows for selective/controlled modulation of the resonant frequency of the transmon qubit formed by the Josephson junction 104, the pad 106, and the pad 108.

The inventors of various embodiments of the invention utilized computer-aided design software to perform computational simulations of a superconducting qubit structure that is topologically equivalent to that depicted in FIG. 1. Some simulations were conducted in situations where the superconducting bridge 116 is severable, and other simulations were conducted in situations where the superconducting bridge 116 is weldable. Such simulations demonstrated how the surface current density distributions of the trimmable inductor 110 can change in response to severing and/or welding of the superconducting bridge 116.

The former simulations showed that, when the superconducting bridge 116 is unsevered, the surface current density in the first conductive path 112 is relatively high and the surface current density in the second conductive path 114 is relatively low. The former simulations also showed that, when the superconducting bridge 116 is severed, the surface current density in the first conductive path 112 becomes relatively low and the surface current density in the second conductive path 114 becomes relatively high. In other words, the first conductive path 112 is primarily electrically active and the second conductive path 114 is primarily electrically inactive when the superconducting bridge 116 is unsevered, and the first conductive path 112 becomes primarily electrically inactive and the second conductive path 114 becomes primarily electrically active when the superconducting bridge 116 is severed.

The latter simulations showed analogous results. Specifically, the latter simulations showed that, when the superconducting bridge 116 is unwelded, the surface current density in the first conductive path 112 is relatively low and the surface current density in the second conductive path 114 is relatively high. The latter simulations also showed that, when the superconducting bridge 116 is welded, the surface current density in the first conductive path 112 becomes relatively high and the surface current density in the second conductive path 114 becomes relatively low. In other words, the first conductive path 112 is primarily electrically inactive and the second conductive path 114 is primarily electrically active when the superconducting bridge 116 is unwelded, and the first conductive path 112 becomes primarily electrically active and the second conductive path 114 becomes primarily electrically inactive when the superconducting bridge 116 is welded.

These simulation results demonstrate how the electrical characteristics of the trimmable inductor 110 can be controlled via severing/welding of the superconducting bridge 116. Controlling the electrical characteristics of the trimmable inductor 110 in this way thus allows for commensurate controlling of the resonant frequency of the transmon qubit formed by the Josephson junction 104, the pad 106, and the pad 108.

Those having ordinary skill in the art will appreciate that the Josephson junction 104, the pad 106, the pad 108, and/or the trimmable inductor 110 can be manufactured on the substrate 102 via any suitable microfabrication and/or nanofabrication techniques (e.g., deposition, etching, angled evaporation, photolithography, patterning).

Figure 2:
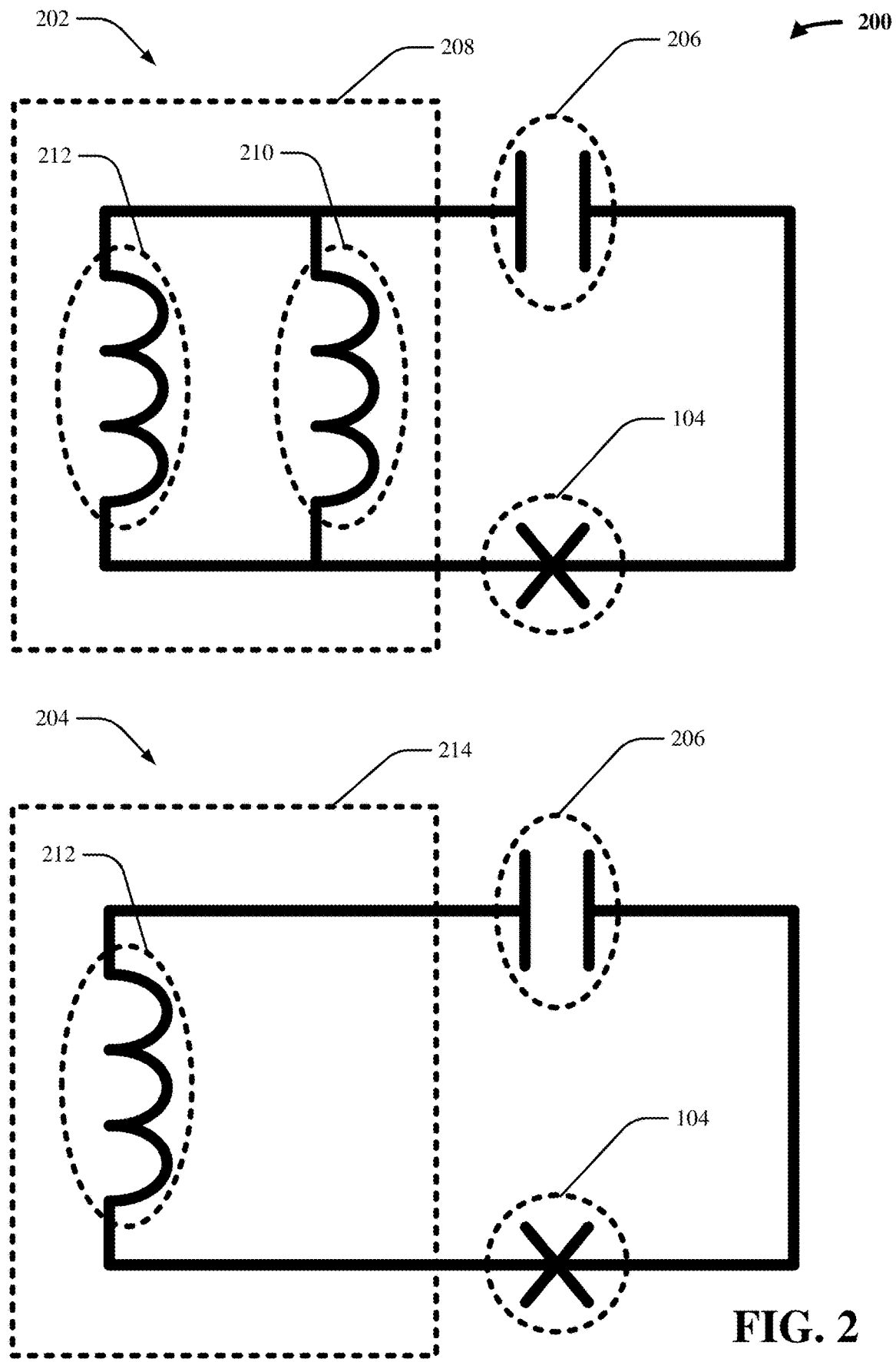
FIG. 2 illustrates example, non-limiting circuit diagrams of a trimmable inductor in accordance with one or more embodiments described herein.

FIG. 2 illustrates example, non-limiting circuit diagrams 200 of a trimmable inductor in accordance with one or more embodiments described herein. As shown, FIG. 2 depicts a circuit diagram 202 and a circuit diagram 204.

Suppose that the superconducting bridge 116 is severable. In such case, the circuit diagram 202 can be considered as representing the electrical characteristics of the transmon qubit formed by the Josephson junction 104, the pad 106, and/or the pad 108 prior to severing of the superconducting bridge 116, and the circuit diagram 204 can be considered as representing the electrical characteristics of the transmon qubit formed by the Josephson junction 104, the pad 106, and/or the pad 108 after severing of the superconducting bridge 116.

As shown in the circuit diagram 202, the Josephson junction 104 can be shunted by a capacitance 206. In various cases, the capacitance 206 can be the capacitance exhibited by the planar capacitor formed by the pad 106 and the pad 108. Also as shown in the circuit diagram 202, an equivalent inductance 208 can be coupled in series between the Josephson junction 104 and the capacitance 206. In various aspects, the equivalent inductance 208 can be the overall and/or equivalent inductance exhibited by the trimmable inductor 110 before severing of the superconducting bridge 116. As shown, the equivalent inductance 208 can comprise two sub-inductances that are coupled together in parallel: a sub-inductance 210 and a sub-inductance 212. In various instances, the sub-inductance 210 can be the inductance exhibited by the first conductive path 112 when the first conductive path 112 is in an electrically-closed state, and the sub-inductance 212 can be the inductance exhibited by the second conductive path 114. Because the sub-inductance 210 and the sub-inductance 212 are in parallel with each other, the equivalent inductance 208 can be equal to the reciprocal of the sum of the reciprocals of the sub-inductance 210 and the sub-inductance 212. Accordingly, the equivalent inductance 208 can be lesser than each of the sub-inductance 210 and the sub-inductance 212.

As shown in the circuit diagram 204, the Josephson junction 104 can be shunted by the capacitance 206, as described above. Also as shown in the circuit diagram 204, an equivalent inductance 214 can be coupled in series between the Josephson junction 104 and the capacitance 206. In various aspects, the equivalent inductance 214 can be the overall and/or equivalent inductance exhibited by the trimmable inductor 110 after severing of the superconducting bridge 116. As shown, the equivalent inductance 214 can comprise one sub-inductance: the sub-inductance 212 which can be exhibited by the second conductive path 114. In other words, after severing of the superconducting bridge 116, electric current can no longer flow across the first conductive path 112, which means that the sub-inductance 210 no longer electrically interacts with the Josephson junction 104. Accordingly, the sub-inductance 210 is not depicted in the circuit diagram 204. Thus, the equivalent inductance 214 can be equal to the sub-inductance 212, which can be greater than the equivalent inductance 208.

Therefore, when the superconducting bridge 116 is severable, severing the superconducting bridge 116 can increase the overall and/or equivalent inductance of the trimmable inductor 110 from the equivalent inductance 208 to the equivalent inductance 214. This can correspondingly cause a decrease in the resonant frequency of the transmon qubit formed by the Josephson junction 104, the pad 106, and the pad 108.

On the other hand, if the superconducting bridge 116 is weldable instead of severable, the circuit diagram 204 can be considered as representing the electrical characteristics of the transmon qubit formed by the Josephson junction 104, the pad 106, and the pad 108 prior to welding of the superconducting bridge 116, and the circuit diagram 202 can be considered as representing the electrical characteristics of the transmon qubit formed by the Josephson junction 104, the pad 106, and the pad 108 after welding of the superconducting bridge 116. Therefore, when the superconducting bridge 116 is weldable, welding the superconducting bridge 116 can decrease the overall and/or equivalent inductance of the trimmable inductor 110 from the equivalent inductance 214 to the equivalent inductance 208. This can correspondingly cause an increase in the resonant frequency of the transmon qubit formed by the Josephson junction 104, the pad 106, and the pad 108.

As explained above, severable superconducting bridges can be used to create a trimmable inductor that can be easily modulated during post-fabrication processing to tune the resonant frequency of a superconducting qubit. When one or more of such severable superconducting bridges are severed, the inductance of the trimmable inductor can be increased by a known amount (e.g., which can be a function of the materials, geometry, and/or topology of the trimmable inductor), which can cause a corresponding decrease in resonant frequency. In some embodiments, a severable superconducting bridge can be considered as a superconducting fuse that can transition from a superconducting state (e.g., an electrically-closed state) to a non-superconducting state (e.g., an electrically-open state) in response to any suitable external stimuli (e.g., thermal stimulation, electrical stimulation, optical stimulation). As also explained above, weldable superconducting bridges can be used to create a trimmable inductor that can be easily modulated during post-fabrication processing to tune the resonant frequency of a superconducting qubit. When one or more of such weldable superconducting bridges are welded, the inductance of the trimmable inductor can be decreased by a known amount (e.g., which can be a function of the materials, geometry, and/or topology of the trimmable inductor), which can cause a corresponding increase in resonant frequency. In some embodiments, a weldable superconducting bridge can be considered as a superconducting antifuse that can transition from a non-superconducting state (e.g., an electrically-open state) to a superconducting state (e.g., an electrically-closed state) in response to any suitable external stimuli (e.g., thermal stimulation, electrical stimulation, optical stimulation). Thus, in some cases, a trimmable inductor can be structured so as to have one or more severable superconducting bridges and/or one or more weldable superconducting bridges, thereby allowing the resonant frequency to be controllably shifted up or down as needed/desired.

In various aspects, FIGS. 3-6 and accompanying text explain how to fabricate various example embodiments of severable and/or weldable superconducting bridges.

Figure 3:
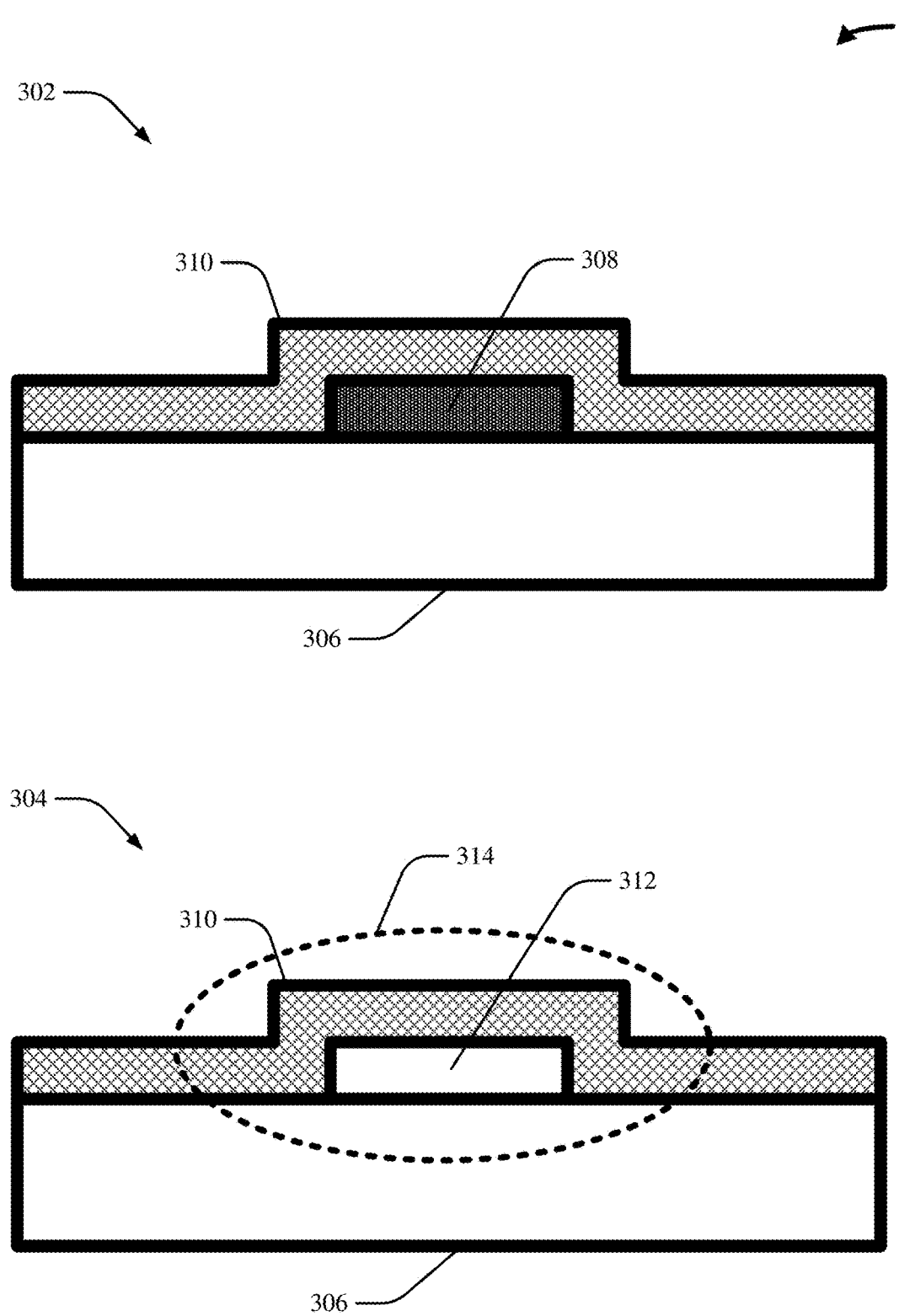
FIG. 3 illustrates block diagrams of an example, non-limiting severable superconducting air bridge that facilitates trimmable inductors for qubit frequency tuning in accordance with one or more embodiments described herein.
Figure 4:
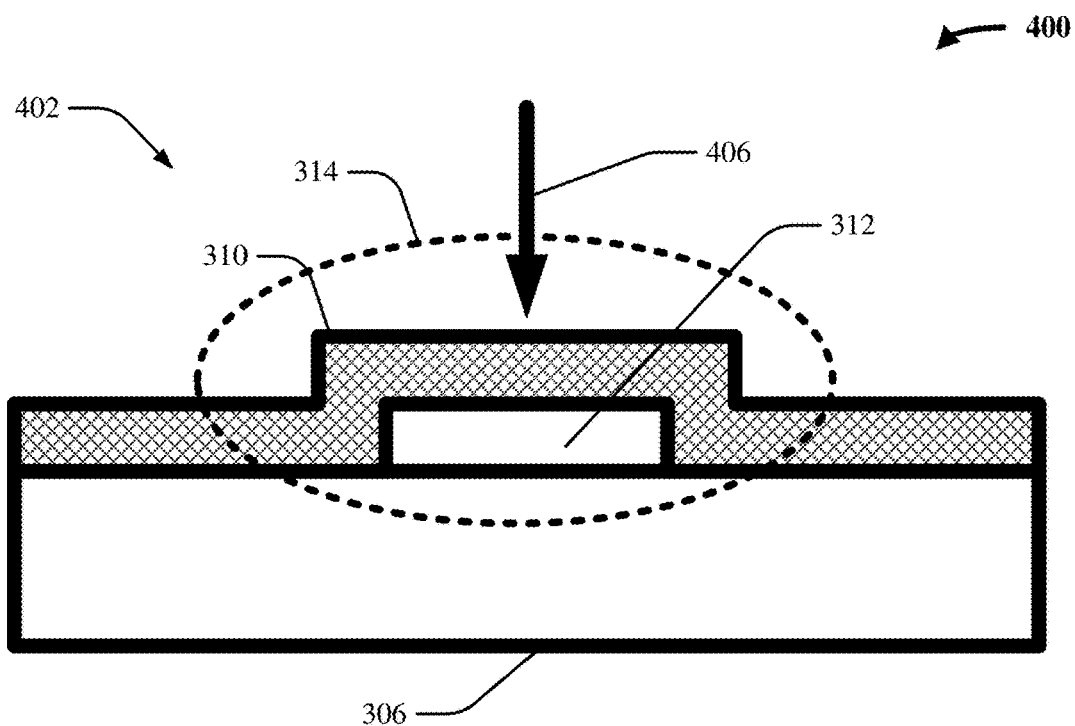
FIG. 4 illustrates block diagrams of severing an example, non-limiting severable superconducting air bridge that facilitates trimmable inductors for qubit frequency tuning in accordance with one or more embodiments described herein.
Figure 4:
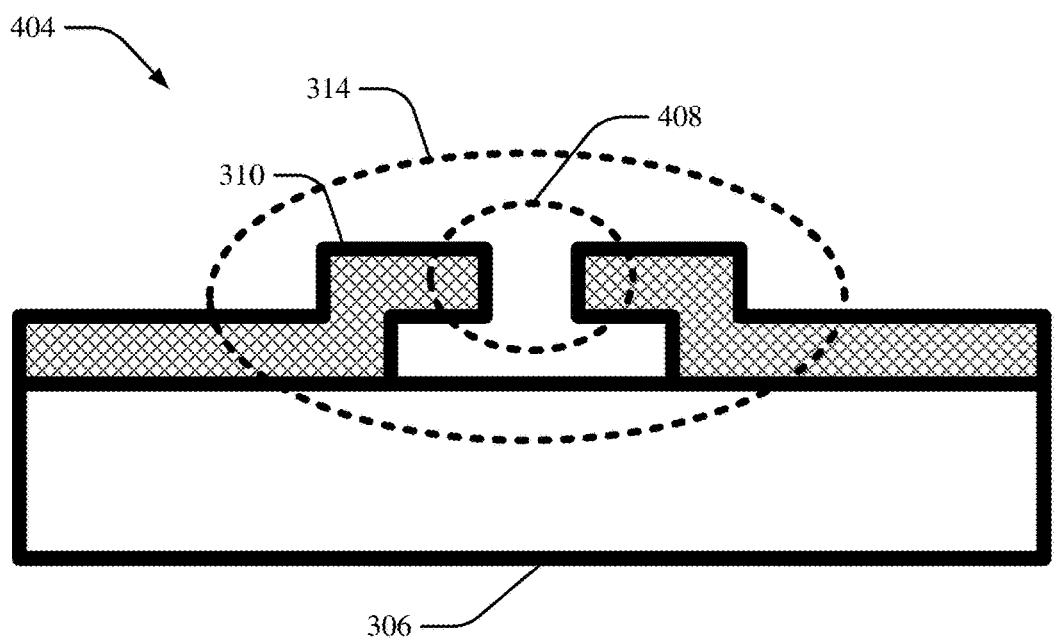

In various embodiments, a severable superconducting bridge can be a superconducting air bridge that is suspended over an underlying substrate surface. FIGS. 3-4 depict example, non-limiting illustrations of such severable superconducting air bridges.

FIG. 3 illustrates block diagrams of an example, non-limiting severable superconducting air bridge that can facilitate trimmable inductors for qubit frequency tuning in accordance with one or more embodiments described herein. More specifically, FIG. 3 depicts how such a severable superconducting air bridge can be fabricated/manufactured.

FIG. 3 depicts a first cross-sectional view 302 and a second cross-sectional view 304. As shown in the first cross-sectional view 302, a sacrificial layer 308 can be formed and/or deposited via any suitable patterning and/or lithographic technique (e.g., oxidation, angled evaporation) on a substrate 306 (e.g., a silicon substrate). In various aspects, the sacrificial layer 308 can be an oxide layer and/or any other suitable sacrificial material used in microfabrication and/or nanofabrication. As also shown in the first cross-sectional view 302, a superconducting layer 310 (e.g., niobium, aluminum, and/or any other suitable superconducting material) can be deposited via any suitable patterning and/or lithographic technique over and/or across the sacrificial layer 308. As shown, the result can be that some portions of the superconducting layer 310 are formed on the substrate 306 while another portion of the superconducting layer 310 is formed on top of the sacrificial layer 308. In other words, the sacrificial layer 308 can be sandwiched between the superconducting layer 310 and the substrate 306. As shown in the second cross-sectional view 304, the sacrificial layer 308 can be removed via any suitable technique (e.g., wet etching, ion milling), thereby leaving an open space 312 where the sacrificial layer 308 previously was located. In various aspects, as shown, this can cause a portion of the superconducting layer 310 to be suspended over the substrate 306 (e.g., a part of the superconducting layer 310 is separated from the substrate 306 by the open space 312). In various aspects, this structure can be considered as a severable superconducting air bridge 314.

Although not explicitly shown in FIG. 3, the severable superconducting air bridge 314 can be fabricated to have any suitable number and/or shapes of perforations and/or any suitable number and/or shapes of tapers. As those having ordinary skill in the art will appreciate, such perforations and/or tapers can reduce an amount of heat needed to melt, ablate, and/or otherwise sever the severable superconducting air bridge 314.

FIG. 4 illustrates block diagrams of severing an example, non-limiting severable superconducting air bridge that can facilitate trimmable inductors for qubit frequency tuning in accordance with one or more embodiments described herein. In other words, FIG. 4 shows how the severable superconducting air bridge 314 of FIG. 3 can be severed.

As shown, FIG. 4 includes a first cross-sectional view 402 and a second cross-sectional view 404. In various aspects, the first cross-sectional view 402 depicts a laser 406 addressing the severable superconducting air bridge 314 from above. In various cases, the laser 406 can be controlled so as to melt and/or ablate the severable superconducting air bridge 314 (e.g., so as to melt and/or ablate the portion of the superconducting layer 310 that is separated from the substrate 306 by the open space 312). As shown in the second cross-sectional view 404, such melting/ablating can create a severed/trimmed portion 408 in the severable superconducting air bridge 314 (e.g., can sever/trim the suspended portion of the superconducting layer 310).

In various aspects, the laser 406 can be aimed and/or directed along any suitable angle/direction. Although not explicitly shown in FIG. 4, the laser 406 can, in some embodiments, address the severable superconducting air bridge 314 from below (e.g., from below the substrate 306). Indeed, in various aspects, the substrate 306 can be transparent and/or substantially transparent to various ranges of laser wavelengths. Thus, a laser whose wavelength is within such various ranges can pass through the substrate 306 without melting/ablating the substrate 306. For example, a silicon substrate can be substantially transparent at laser wavelengths above 1.3 μm.

In various instances, the open space 312 can serve as a thermal barrier that protects the substrate 306 during melting/ablating of the severable superconducting air bridge 314. For instance, consider a severable niobium air bridge on a silicon substrate. In various cases, niobium can melt at 2,477 degrees Celsius and silicon can melt at 1,414 degrees Celsius. In various aspects, the laser 406 can be a continuous wave, long-pulsed and/or short-pulsed laser. In such case, the laser 406 can be used to heat the severable niobium air bridge to beyond its melting point, thereby severing the severable niobium air bridge, while leaving the silicon substrate undamaged. Thus, in various aspects, the laser 406 can sever the severable superconducting air bridge 314 without damaging and/or contaminating the substrate 306. In this way, coherence and/or performance of the superconducting qubit can be not adversely affected.

Although not explicitly shown in FIG. 4, any other suitable severing/trimming technique can be implemented other than the laser 406 (e.g., etching, scribing, heating, etc.).

Although not explicitly shown in FIG. 4, any other suitable severable/trimmable superconducting couplings can be implemented instead of the severable superconducting air bridge 314 (e.g., in some cases, superconducting lines that run along the substrate 306 and/or that are not suspended over the substrate 306 can be implemented). Such other severable/trimmable superconducting couplings can be severed/trimmed in similar fashions.

Figure 5:
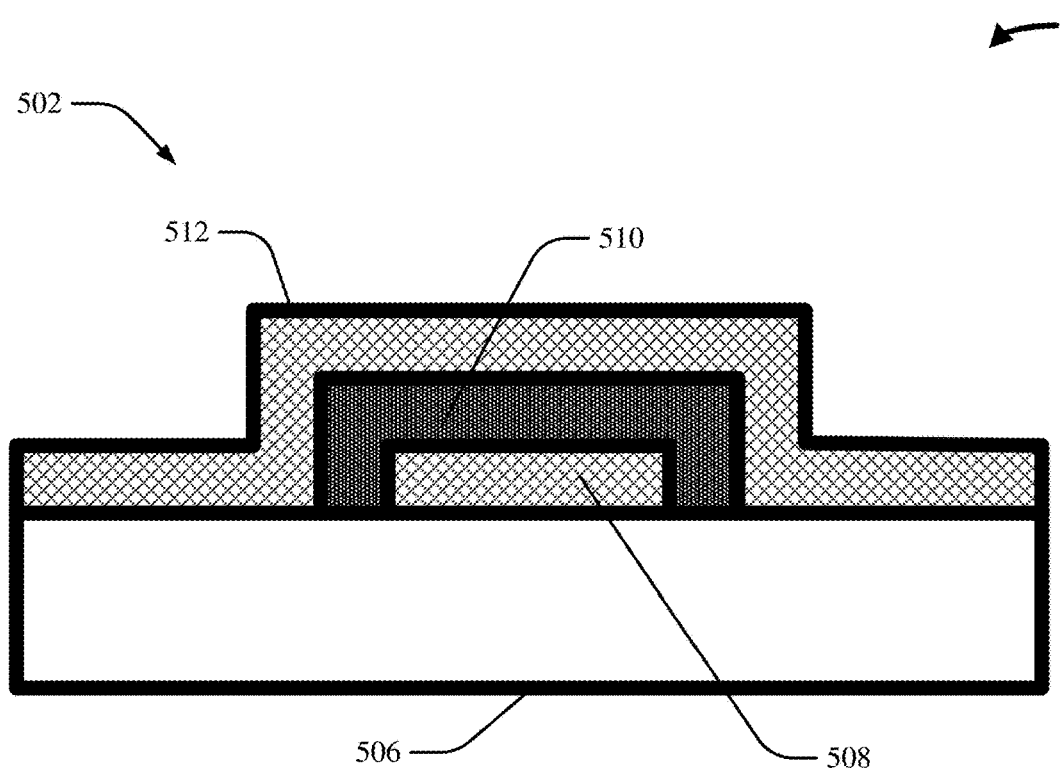
FIG. 5 illustrates block diagrams of an example, non-limiting weldable superconducting air bridge that facilitates trimmable inductors for qubit frequency tuning in accordance with one or more embodiments described herein.
Figure 5:
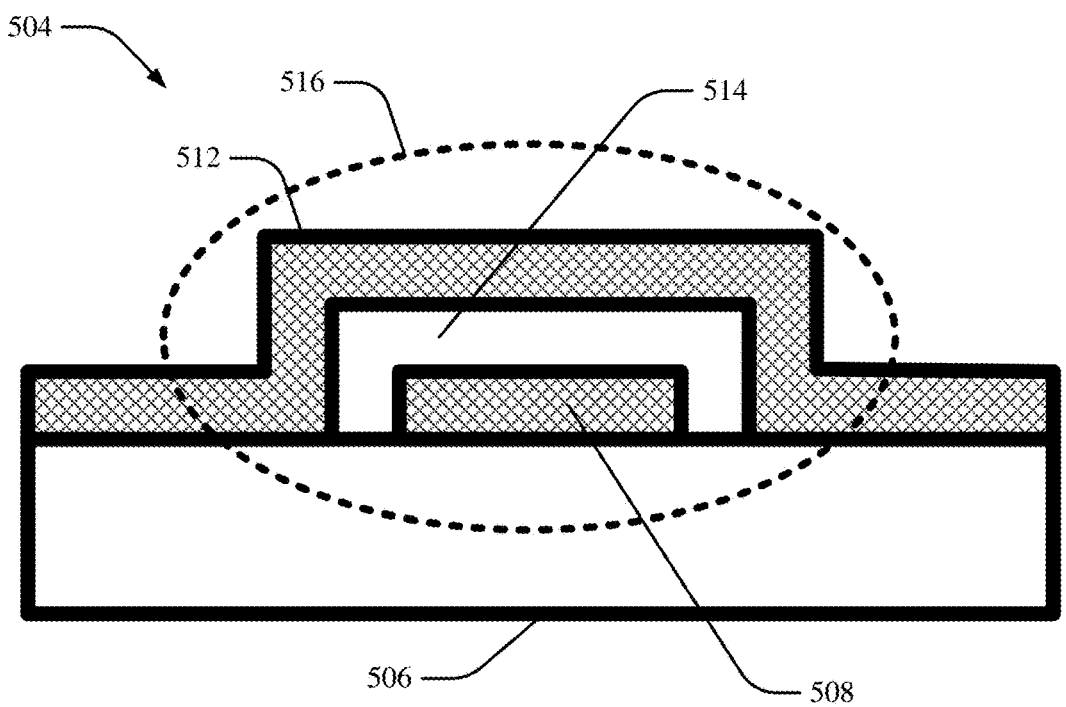
Figure 6:
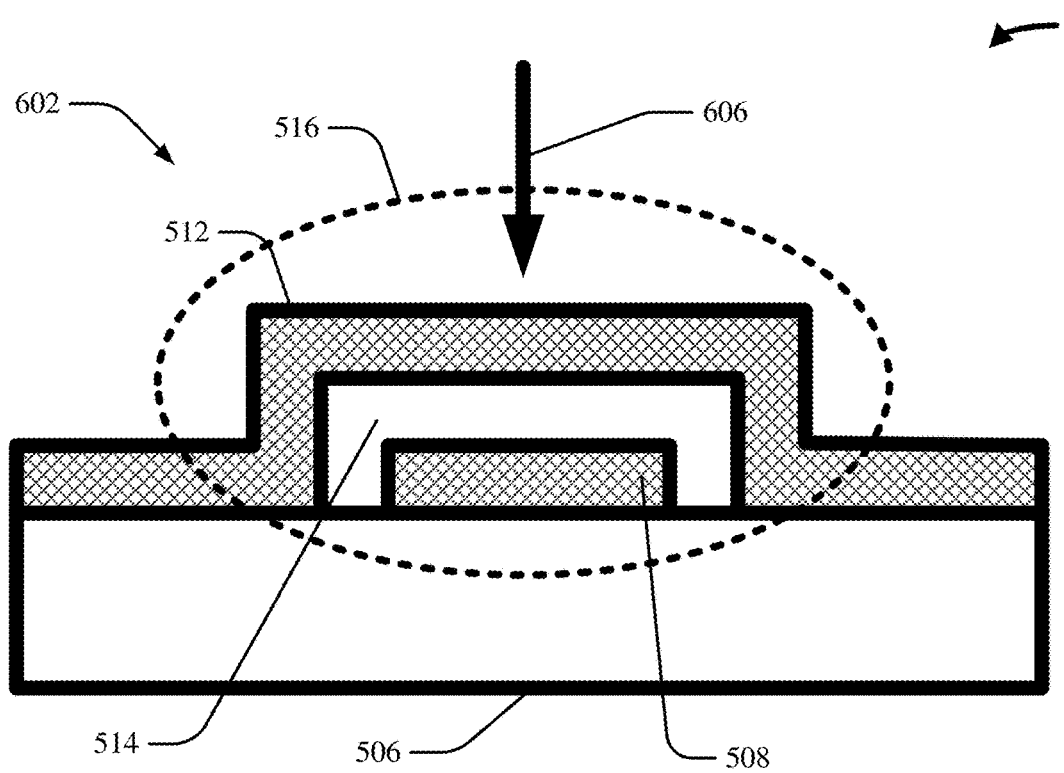
FIG. 6 illustrates block diagrams of welding an example, non-limiting weldable superconducting air bridge that facilitates trimmable inductors for qubit frequency tuning in accordance with one or more embodiments described herein.
Figure 6:
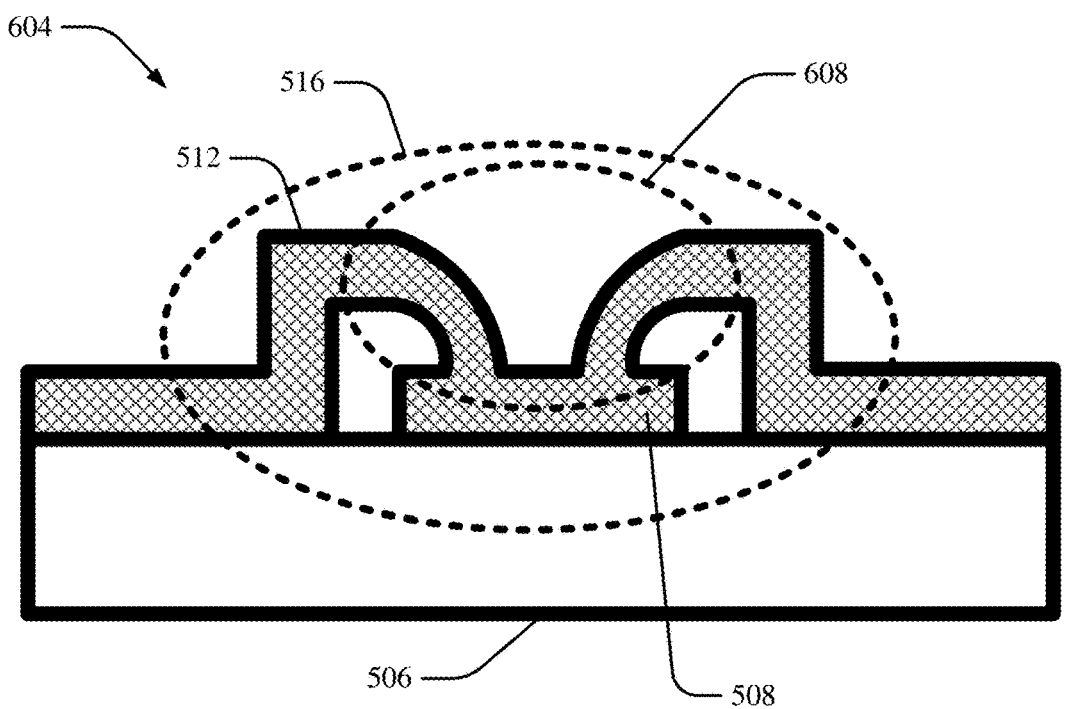

The above discussion pertains to severable superconducting air bridges. Now, consider weldable superconducting air bridges. In various embodiments, a weldable superconducting bridge can be a superconducting air bridge that is suspended over an underlying superconducting line that runs along a substrate surface. FIGS. 5-6 depict example, non-limiting illustrations of such weldable superconducting air bridges.

FIG. 5 illustrates block diagrams of an example, non-limiting weldable superconducting air bridge that can facilitate trimmable inductors for qubit frequency tuning in accordance with one or more embodiments described herein. More specifically, FIG. 5 depicts how such a weldable superconducting air bridge can be fabricated/manufactured.

FIG. 5 depicts a first cross-sectional view 502 and a second cross-sectional view 504. As shown in the first cross-sectional view 502, a first superconducting layer 508 (e.g., niobium, aluminum) can be deposited via any suitable patterning and/or lithographical technique (e.g., angled evaporation) on a substrate 506. Similarly, a sacrificial layer 510 (e.g., oxide) can be formed and/or deposited via any suitable patterning and/or lithographic technique (e.g., oxidation, angled evaporation) on and/or over top of the first superconducting layer 508. As also shown in the first cross-sectional view 502, a second superconducting layer 512 (e.g., niobium, aluminum) can be deposited via any suitable patterning and/or lithographic technique over and/or across the sacrificial layer 510. As shown, the result can be that some portions of the second superconducting layer 512 are formed on the substrate 506 while another portion of the second superconducting layer 512 is formed on top of the sacrificial layer 510. In other words, the sacrificial layer 510 can be sandwiched between the second superconducting layer 512 and the first superconducting layer 508. As shown in the second cross-sectional view 504, the sacrificial layer 510 can be removed via any suitable technique (e.g., wet etching, ion milling), thereby leaving an open space 514 where the sacrificial layer 510 previously was located. In various aspects, as shown, this can cause a portion of the second superconducting layer 512 to be suspended over both the substrate 506 and the first superconducting layer 508 (e.g., a part of the second superconducting layer 512 is separated from the substrate 506 and/or from the first superconducting layer 508 by the open space 514). In various aspects, this structure can be considered as a weldable superconducting air bridge 516.

In various aspects, the weldable superconducting air bridge 516 can include perforations and/or tapered notches, as described above.

FIG. 6 illustrates block diagrams of welding an example, non-limiting weldable superconducting air bridge that can facilitate trimmable inductors for qubit frequency tuning in accordance with one or more embodiments described herein. In other words, FIG. 6 shows how the weldable superconducting air bridge 516 of FIG. 6 can be welded.

As shown, FIG. 6 includes a first cross-sectional view 602 and a second cross-sectional view 604. In various aspects, the first cross-sectional view 602 depicts a laser 606 addressing the weldable superconducting air bridge 516 from above. Just as described above with respect to FIG. 4, in various cases, the laser 606 can be controlled so as to melt and/or ablate the weldable superconducting air bridge 516 (e.g., so as to melt and/or ablate the portion of the second superconducting layer 512 that is separated from the substrate 506 and the first superconducting layer 508 by the open space 514). As shown in the second cross-sectional view 604, such melting/ablating can create a welded portion 608 in the weldable superconducting air bridge 516 (e.g., can weld and/or fuse the suspended portion of the second superconducting layer 512 to the first superconducting layer 508).

In various aspects, the laser 606 can be aimed and/or directed along any suitable angle/direction. Although not explicitly shown in FIG. 6, the laser 606 can, in some embodiments, address the weldable superconducting air bridge 516 from below (e.g., from below the substrate 506), as described above with respect to FIG. 4 (e.g., in various aspects, the substrate 506 can be transparent and/or substantially transparent to various ranges of laser wavelengths).

Although not explicitly shown in FIG. 6, any other suitable welding technique can be implemented other than the laser 606 (e.g., any suitable localized heating technique). For instance, in some cases, any suitable micromanipulations can be implemented so as to weld a weldable superconducting air bridge. As a non-limiting example, any suitable microtool integrated into a translatable stage, platform, and/or end effector can be implemented so as to physically press and/or deform the suspended portion of the second superconducting layer 512, such that the suspended portion of the second superconducting layer 512 is now in physical contact with the first superconducting layer 508. In various cases, such physical deformation can cause the weldable superconducting air bridge 516 to be in a welded state.

Those having ordinary skill in the art will appreciate that FIGS. 5-6 depict a mere non-limiting example of a weldable superconducting antifuse. In various cases, any other suitable weldable superconducting antifuses can be implemented in various embodiments of the invention. For example, in some cases, a diffusion-based superconducting antifuse can be implemented. In such case, a dielectric material (e.g., silicon) can be sandwiched between two superconducting materials (e.g., niobium and/or aluminum). Accordingly, the two superconducting materials can be electrically isolated from each other initially. In various aspects, application of heat (e.g., via a laser) to such structure can cause one of the superconducting materials to diffuse into the dielectric layer (e.g., aluminum can diffuse into silicon at temperatures greater than and/or equal to 500 degrees Celsius). Thus, after application of such heat, the two superconducting materials can now be no longer electrically isolated from each other (e.g., the diffused region in the dielectric layer can conduct electricity). As another example, a flow-based superconducting antifuse can be implemented in various embodiments of the invention. In such case, two or more abutting superconducting materials can be separated by a spatial gap (e.g., the spatial gap can be on the order of nanometers and/or micrometers wide). Accordingly, the two superconducting materials can be electrically isolated from each other initially. In various aspects, application of heat to the portions of the superconducting materials that are adjacent to the spatial gap can cause such portions of the superconducting materials to melt and laterally flow together across the spatial gap. Thus, after application of such heat, the two superconducting materials can now be no longer electrically isolated from each other (e.g., because they flowed across the gap, they can be in contact with each other).

As described above, a superconducting qubit can comprise a planar capacitor, a Josephson junction, and a trimmable superconducting inductor that couples the Josephson junction to at least one pad of the planar capacitor. In various cases, the trimmable inductor can comprise a first conductive path having a severable and/or weldable superconducting bridge (e.g., superconducting fuse and/or antifuse) and a second conductive path that is in parallel with the first conductive path. When a severable superconducting bridge is implemented, it can be severed by laser heating so as to increase the inductance of the trimmable inductor by a discrete amount corresponding to size, shape, dimensions, layout, and/or materials of the trimmable inductor, thereby decreasing the superconducting qubit's resonant frequency. Similarly, when a weldable superconducting bridge is implemented, it can be welded/fused by laser heating so as to decrease the inductance of the trimmable inductor by a discrete amount corresponding to the size, shape, dimensions, layout, and/or materials of the trimmable inductor, thereby increasing the superconducting qubit's resonant frequency. In this way, both severable and/or weldable superconducting bridges can be implemented in a superconducting qubit's trimmable inductor design so that the superconducting qubit's resonant frequency can be tuned up or down as desired.

As shown in FIG. 1, in various embodiments, the trimmable inductor 110 can be located externally of the pad 108. In other words, the first conductive path 112 and/or the second conductive path 114 can coil, spiral, and/or meander on the surface of the substrate 102 without being surrounded by the pad 108. In other cases, however, the trimmable inductor 110 can be located internally of the pad 108, as shown in FIG. 7.

Figure 7:
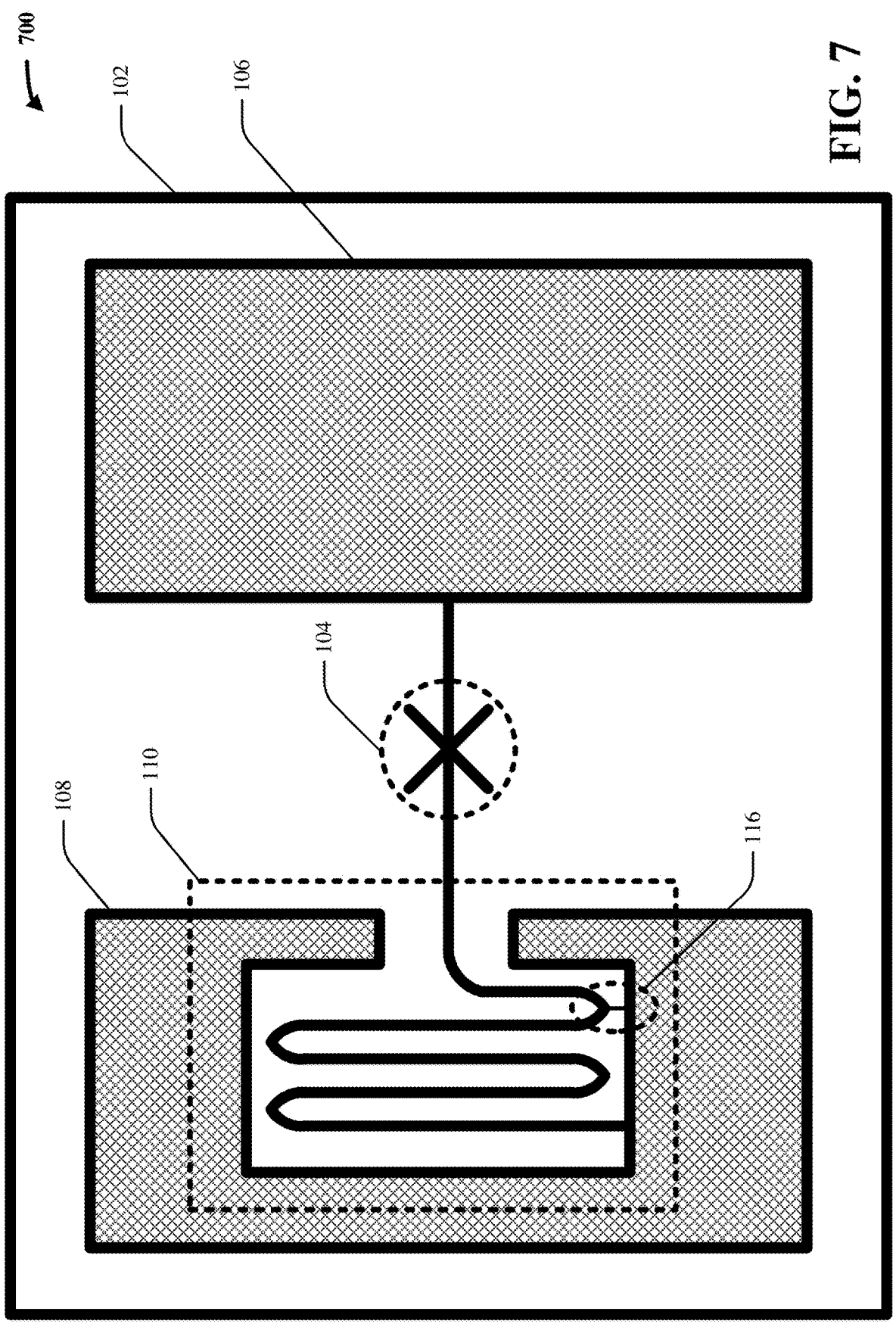
FIG. 7 illustrates a block diagram of an example, non-limiting device including an internally-meandering trimmable inductor in accordance with one or more embodiments described herein.

FIG. 7 illustrates a block diagram of an example, non-limiting device 700 including an internally-meandering trimmable inductor in accordance with one or more embodiments described herein.

For purposes of visual clarity, the first conductive path 112 and the second conductive path 114 are not indicated by call-out numerals in FIG. 7 (e.g., otherwise, FIG. 7 would become too cluttered). However, the superconducting bridge 116 is called-out in FIG. 7.

As shown in FIG. 7, in various embodiments, the pad 108 can be fabricated on the substrate 102 so as to have a portion that is cut-out and/or removed as compared to the design of the pad 108 shown in FIG. 1. As illustrated, in various instances, the trimmable inductor 110 can be formed on the surface of the substrate 102 in this cut-out region of the pad 108. In such case, the trimmable inductor 110 can be considered as being located internally of the pad 108. In other words, the coils, spirals, and/or meandering portions of the trimmable inductor 110 (e.g., the first conductive path 112 and the second conductive path 114) can be positioned on the substrate 102 such that they are surrounded by the pad 108. In various aspects, fabricating the trimmable inductor 110 such that it is located internally of the pad 108 can help to save space (e.g., chip real estate) on the surface of the substrate 102 (e.g., can reduce a surface area footprint of the transmon qubit formed by the Josephson junction 104, the pad 106, and the pad 108).

Those having ordinary skill in the art will appreciate that the circuit diagrams depicted in FIG. 2 can be applicable to the internally-meandering inductor design shown in FIG. 7. That is, regardless of whether the trimmable inductor 110 is located externally to the pad 108 (e.g., as in FIG. 1) or internally to the pad 108 (e.g., as in FIG. 7), the trimmable inductor 110 can nevertheless comprise two conductive paths (e.g., 112 and 114) arranged in parallel, one of which includes a severable and/or weldable superconducting bridge (e.g., 116), such that the inductance of the trimmable inductor 110 can be controllably modulated during post-fabrication processing by severing and/or welding the superconducting bridge.

Although FIG. 7 depicts the cut-out and/or removed region of the pad 108 as being rectangular in shape, those having ordinary skill in the art will appreciate that this is a mere non-limiting example. In various cases, the cut-out and/or removed region of the pad 108 can have any suitable size, shape, and/or dimensions. Furthermore, those having ordinary skill in the art will appreciate that any suitable microfabrication and/or nanofabrication techniques can be implemented to create such a cut-out and/or removed region of the pad 108 (e.g., deposition, etching, angled evaporation, photolithography, patterning).

Although not shown in figures, those having ordinary skill in the art will appreciate that the trimmable inductor 110 can be designed and/or fabricated so as to be both externally and internally located to the pad 108. In other words, some portion of the trimmable inductor 110 can be internally located to the pad 108 while some other portion of the trimmable inductor 110 can be externally located to the pad 108. Indeed, in various embodiments, the trimmable inductor 110 can have any suitable layout on the surface of the substrate 102.

Thus far, the above discussion mainly describes embodiments of a trimmable inductor that comprises two parallel conductive paths, one path of which includes a severable and/or weldable superconducting bridge. In various aspects, however, a trimmable inductor can comprise any suitable number of parallel conductive paths and any suitable number of severable and/or weldable superconducting bridges. Such embodiments are more fully described with respect to FIG. 8.

Figure 8:
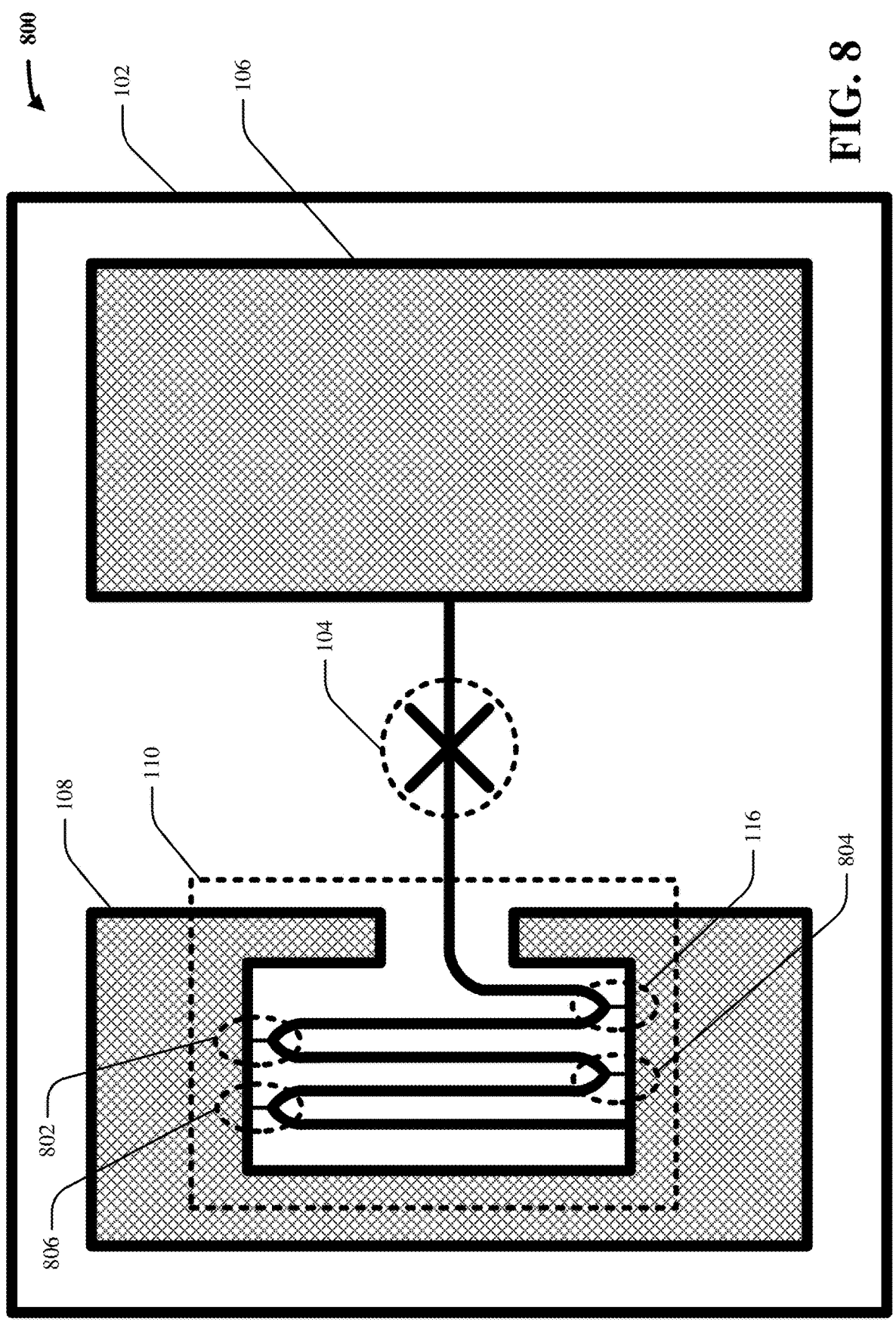
FIG. 8 illustrates a block diagram of an example, non-limiting device including a stepwise-trimmable inductor in accordance with one or more embodiments described herein.

FIG. 8 illustrates a block diagram of an example, non-limiting device 800 including a stepwise-trimmable inductor in accordance with one or more embodiments described herein.

As shown in FIG. 8, the substrate 102, the Josephson junction 104, the pad 106, and the pad 108 can be as described above, and the trimmable inductor 110 can be internally-located to the pad 108, as described with respect to FIG. 7. However, as shown, the trimmable inductor 110 can comprise more than just the superconducting bridge 116. For instance, in the non-limiting example shown, the trimmable inductor 110 can comprise three other superconducting bridges 802, 804, and 806, each of which can be severable and/or weldable. Accordingly, as shown in FIG. 8, the trimmable inductor 110 can provide five parallel conductive paths between the Josephson junction 104 and the pad 108: a first conductive path that includes the superconducting bridge 116, a second conductive path that includes the superconducting bridge 802, a third conductive path that includes the superconducting bridge 804, a fourth conductive path that includes the superconducting bridge 806, and a fifth conductive path that includes none of the superconducting bridges 116 or 802-806.

As described above, when the trimmable inductor 110 has only two conductive paths, one of which includes the superconducting bridge 116, the trimmable inductor 110 can be modulated during post-fabrication processing once by severing and/or welding the superconducting bridge 116.

In contrast, in the non-limiting example shown in FIG. 8, the trimmable inductor 110 can be modulated during post-fabrication processing four times by individually severing and/or welding the four superconducting bridges 116 and/or 802-806. In other words, a first overall/equivalent inductance value of the trimmable inductor 110 can be achieved by severing/welding none of the superconducting bridges 116 and 802-806; a second overall/equivalent inductance value of the trimmable inductor 110 can be achieved by severing/welding the superconducting bridge 116; a third overall/equivalent inductance value of the trimmable inductor 110 can be achieved by severing/welding the superconducting bridge 116 and the superconducting bridge 802; a fourth overall/equivalent inductance value of the trimmable inductor 110 can be achieved by severing/welding the superconducting bridge 116, the superconducting bridge 802, and the superconducting bridge 804; and a fifth overall/equivalent inductance value of the trimmable inductor 110 can be achieved by severing/welding all of the superconducting bridges 116 and 802-806. For example, if it is desired to increase the inductance of the trimmable inductor 110, the superconducting bridge 116 can be severed. Then, if it is desired to further decrease the inductance of the trimmable inductor 110, the superconducting bridge 802 can be severed (e.g., after the superconducting bridge 116 was severed).

Accordingly, in various cases, the superconducting bridges 116 and/or 802-806 can be progressively trimmed (e.g., severed and/or welded, as applicable) in order to alter the inductance of the trimmable inductor 110 as desired. In other words, the trimmable inductor 110, when structured as shown in FIG. 8, can be tuned during post-fabrication processing to one of a range of at least five discrete inductance values. In some cases, more than five discrete inductance values can be achieved (e.g., by severing and/or welding different combinations/permutations of the superconducting bridges 116 and/or 802-806).

In general, the trimmable inductor 110 can, in various embodiments, comprise n conductive paths for any suitable positive integer n, where the n conductive paths are in parallel with each other, and the trimmable inductor 110 can accordingly include n-1 superconducting bridges (e.g., no bridge in one of the conductive paths, and one bridge in each of the remaining conductive paths). In such case, the overall/equivalent inductance of the trimmable inductor 110 can be controllably tuned to at least n discrete values by controllably severing and/or welding the n-1 superconducting bridges. Thus, finer and/or more granular changes in inductance of the trimmable inductor 110 can be achieved when more superconducting bridges are implemented as compared to when fewer superconducting bridge are implemented, which can mean that finer and/or more granular changes in resonant frequency can be achieved.

Figure 9:
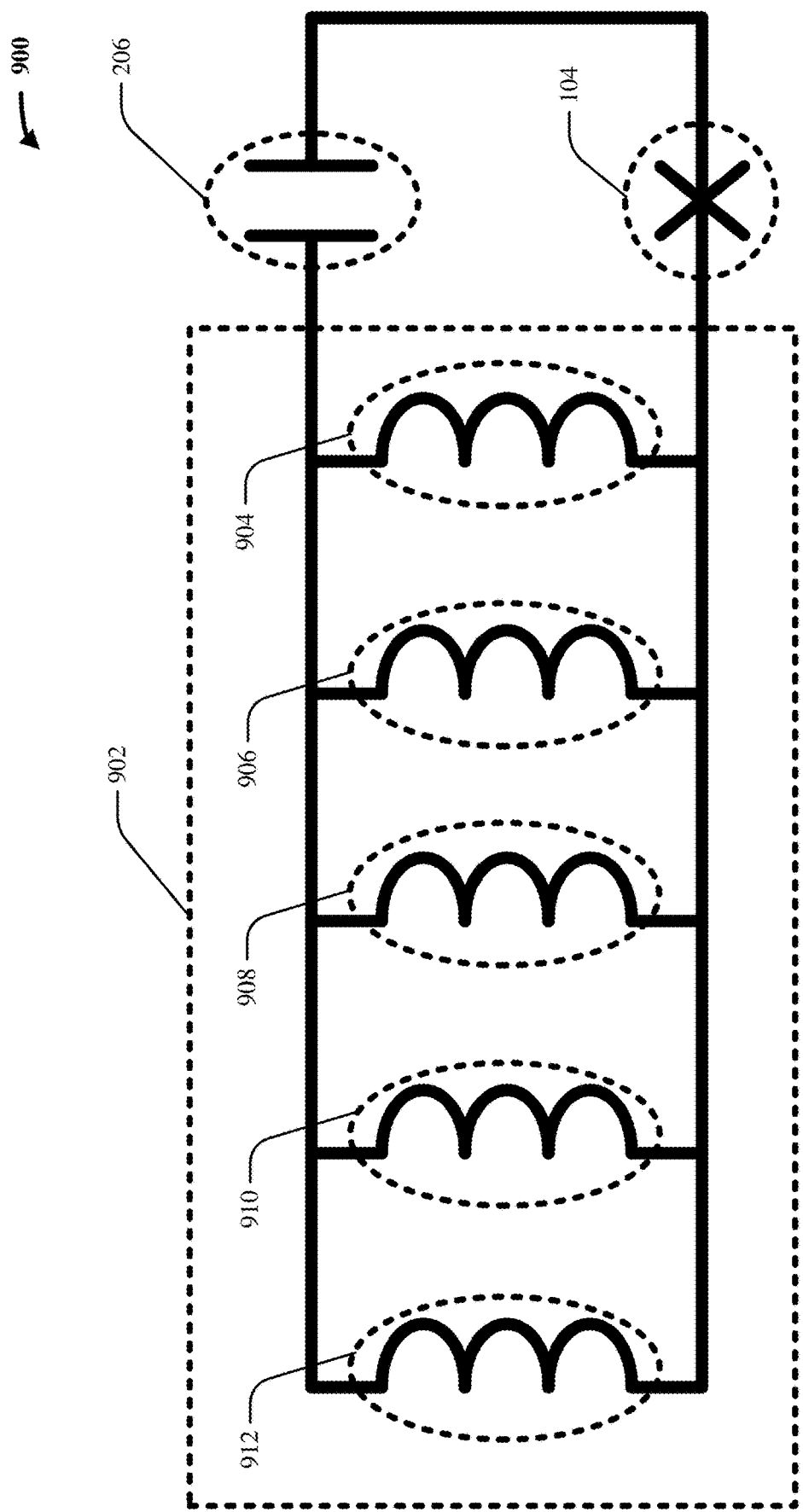
FIG. 9 illustrates an example, non-limiting circuit diagram of a stepwise-trimmable inductor in accordance with one or more embodiments described herein.

FIG. 9 illustrates an example, non-limiting circuit diagram 900 of a stepwise-trimmable inductor in accordance with one or more embodiments described herein. That is, the circuit diagram 900 can represent the electrical characteristics of the transmon qubit formed by the Josephson junction 104, the pad 106, and the pad 108 shown in FIG. 8, either prior to severing of any of the superconducting bridges 116 and 802-806 and/or after welding all of the superconducting bridges 116 and 802-806.

As shown in the circuit diagram 900, the Josephson junction 104 can be shunted by the capacitance 206, which can be the capacitance exhibited by the planar capacitor formed by the pad 106 and the pad 108. Also as shown in the circuit diagram 900, an equivalent inductance 902 can be coupled in series between the Josephson junction 104 and the capacitance 206. In various aspects, the equivalent inductance 902 can be the overall and/or equivalent inductance exhibited by the trimmable inductor 110 when all of the superconducting bridges 116 and 802-806 are in electrically-closed states (e.g., such as prior to severing and/or after welding). As shown, the equivalent inductance 902 can comprise five sub-inductances that are coupled together in parallel: sub-inductances 904-912. In various instances, the sub-inductance 904 can be the inductance exhibited by the conductive path that includes the superconducting bridge 116 when the superconducting bridge 116 is in an electrically-closed state (e.g., unsevered and/or welded); the sub-inductance 906 can be the inductance exhibited by the conductive path that includes the superconducting bridge 802 when the superconducting bridge 802 is in an electrically-closed state (e.g., unsevered and/or welded); the sub-inductance 908 can be the inductance exhibited by the conductive path that includes the superconducting bridge 804 when the superconducting bridge 804 is in an electrically-closed state (e.g., unsevered and/or welded); the sub-inductance 910 can be the inductance exhibited by the conductive path that includes the superconducting bridge 806 when the superconducting bridge 806 is in an electrically-closed state (e.g., unsevered and/or welded); and the sub-inductance 912 can be the inductance exhibited by the conductive path that includes none of the superconducting bridges 116 and 802-806. Because the sub-inductances 904-912 are in parallel with each other, the equivalent inductance 902 can be equal to the reciprocal of the sum of the reciprocals of the sub-inductances 904-912. Accordingly, the equivalent inductance 902 can be lesser than each of the sub-inductances 904-912. Thus, as described herein, the equivalent inductance 902 can be controllably increased in stepwise-fashion by progressively severing the superconducting bridges 116 and 802-806, where such severing would progressively eliminate respective ones of the sub-inductances 904-912.

If the superconducting bridges 116 and 802-806 are severable, those having ordinary skill in the art will appreciate that the circuit diagram 900 can represent the trimmable inductor 110 shown in FIG. 8 before any of the superconducting bridges 116 and 802-806 have been severed. On the other hand, if the superconducting bridges 116 and 802-806 are weldable, those having ordinary skill in the art will appreciate that the circuit diagram 900 can represent the trimmable inductor 110 shown in FIG. 8 after all of the superconducting bridges 116 and 802-806 have been welded. In any case, the circuit diagram 900 illustrates that the overall and/or equivalent inductance 902 exhibited by the trimmable inductor 110 can be stepwise-controlled by severing and/or welding the superconducting bridges 116 and 802-806 one at a time. Accordingly, the resonant frequency of the transmon qubit formed by the Josephson junction 104, the pad 106, and the pad 108 can be commensurately stepwise-controlled.

Although the herein discussion mainly describes embodiments where all of the superconducting bridges 116 and 802-806 are severable or where all of the superconducting bridges 116 and 802-806 are weldable, this is a mere non-limiting example. Those having ordinary skill in the art will appreciate that when multiple superconducting bridges are implemented, they can be any suitable combination of severable and/or weldable (e.g., some of the superconducting bridges can be severable while others can be weldable).

Figure 10:
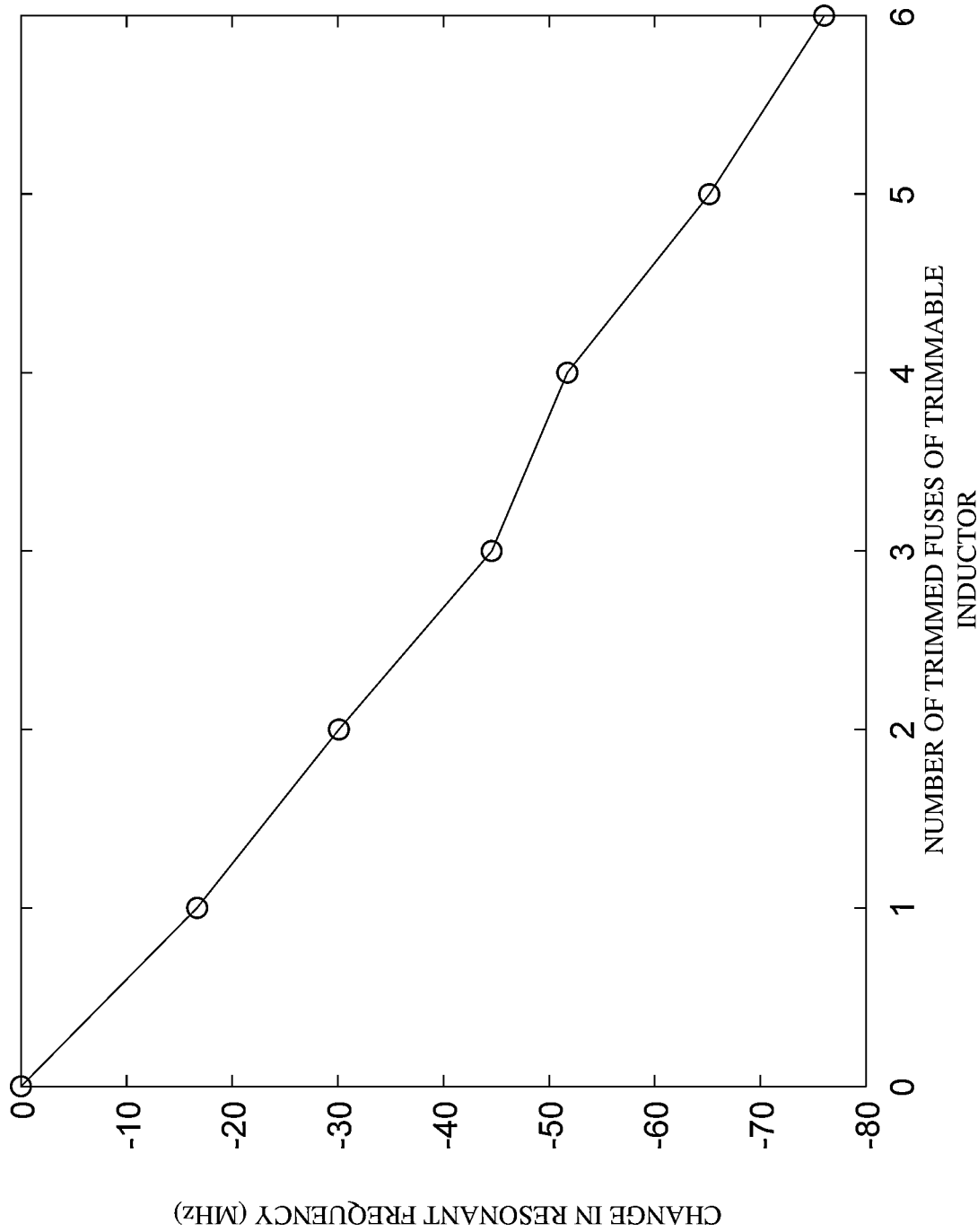
FIG. 10 illustrates example, non-limiting simulation results showing how one or more embodiments described herein influence resonant frequencies of superconducting qubits.

FIG. 10 illustrates example, non-limiting simulation results 1000 showing how one or more embodiments described herein influence resonant frequencies of superconducting qubits. More specifically, the inventors of various embodiments of the invention used computer-aided design software to simulate how the resonant frequency of a transmon qubit would change based on severing the superconducting bridges (e.g., superconducting fuses) of a stepwise-trimmable inductor as described herein. These results indicate that the inductance of a stepwise-trimmable inductor can be finely controlled by progressively trimming severable superconducting bridges of the stepwise-trimmable inductor.

Those having ordinary skill in the art will appreciate that the results shown in FIG. 10 are merely non-limiting example results. In practice, the magnitudes of the discrete changes in inductance of the trimmable inductor 110 can depend upon the size, shape, dimensions, layout, and/or materials of the trimmable inductor 110. In other words, the total tunable range of a superconducting qubit's resonant frequency can depend upon the size, shape, dimensions, layout, and/or materials of the trimmable inductor 110 as well as the number of superconducting bridges of the trimmable inductor 110. Thus, in various cases, the trimmable inductor 110 can be fabricated to have any suitable size, shape, dimensions, layout, and/or materials as well as any suitable number of superconducting bridges (e.g., any suitable number of conductive paths), so as to span a desired/target frequency range with a desired/target tuning resolution.

In various aspects, those having ordinary skill in the art will appreciate that analogous results as those shown in FIG. 10 can be obtained for stepwise-trimmable inductors that comprise weldable superconducting bridges (e.g., antifuses).

Figure 11:
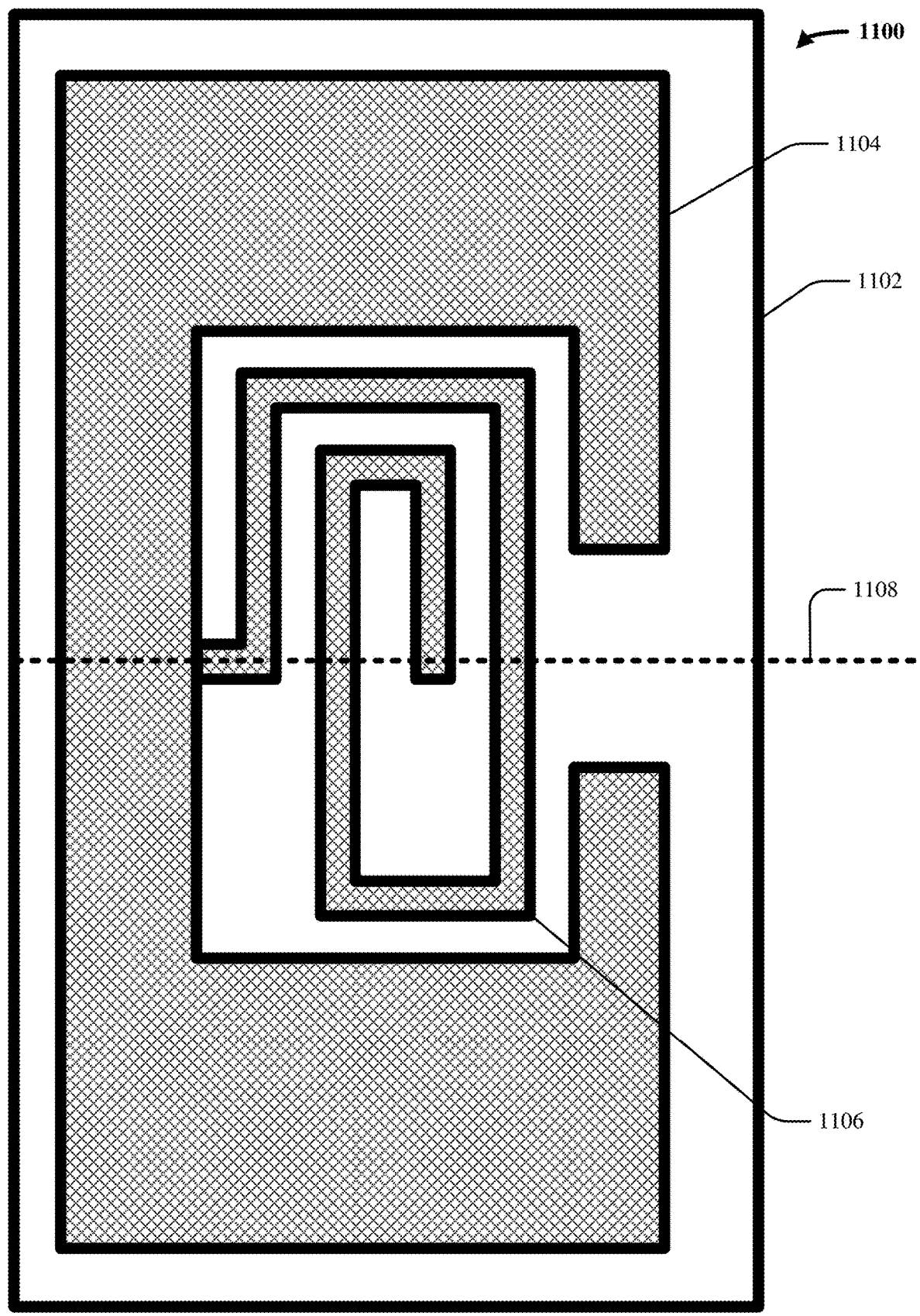

FIGS. 11-19b illustrate block diagrams of an example, non-limiting stepwise-trimmable inductor including diffusion-based antifuses in accordance with one or more embodiments described herein. In various aspects, as illustrated in FIG. 11, for example, a planar capacitor pad 1104 can be fabricated (e.g., via any suitable microfabrication and/or nanofabrication technique) on a substrate 1102 (e.g., silicon substrate). In various instances, as shown, the planar capacitor pad 1104 can be fabricated so as to have a cut-out region. In various cases, a spiraled superconducting wire 1106 can be fabricated (e.g., via any suitable microfabrication and/or nanofabrication technique) on the substrate 1102 within the cut-out region of the planar capacitor pad 1104. In various aspects, the planar capacitor pad 1104 can have any suitable size, shape, and/or dimensions, and can be comprised of any suitable superconducting material (e.g., niobium). Similarly, in various instances, the spiraled superconducting wire 1106 can have any suitable size, shape, and/or dimensions, and can be comprised of any suitable superconducting material (e.g., niobium). As explained below, the spiraled superconducting wire 1106 can be used to create a stepwise-trimmable inductor.

Figure 12:
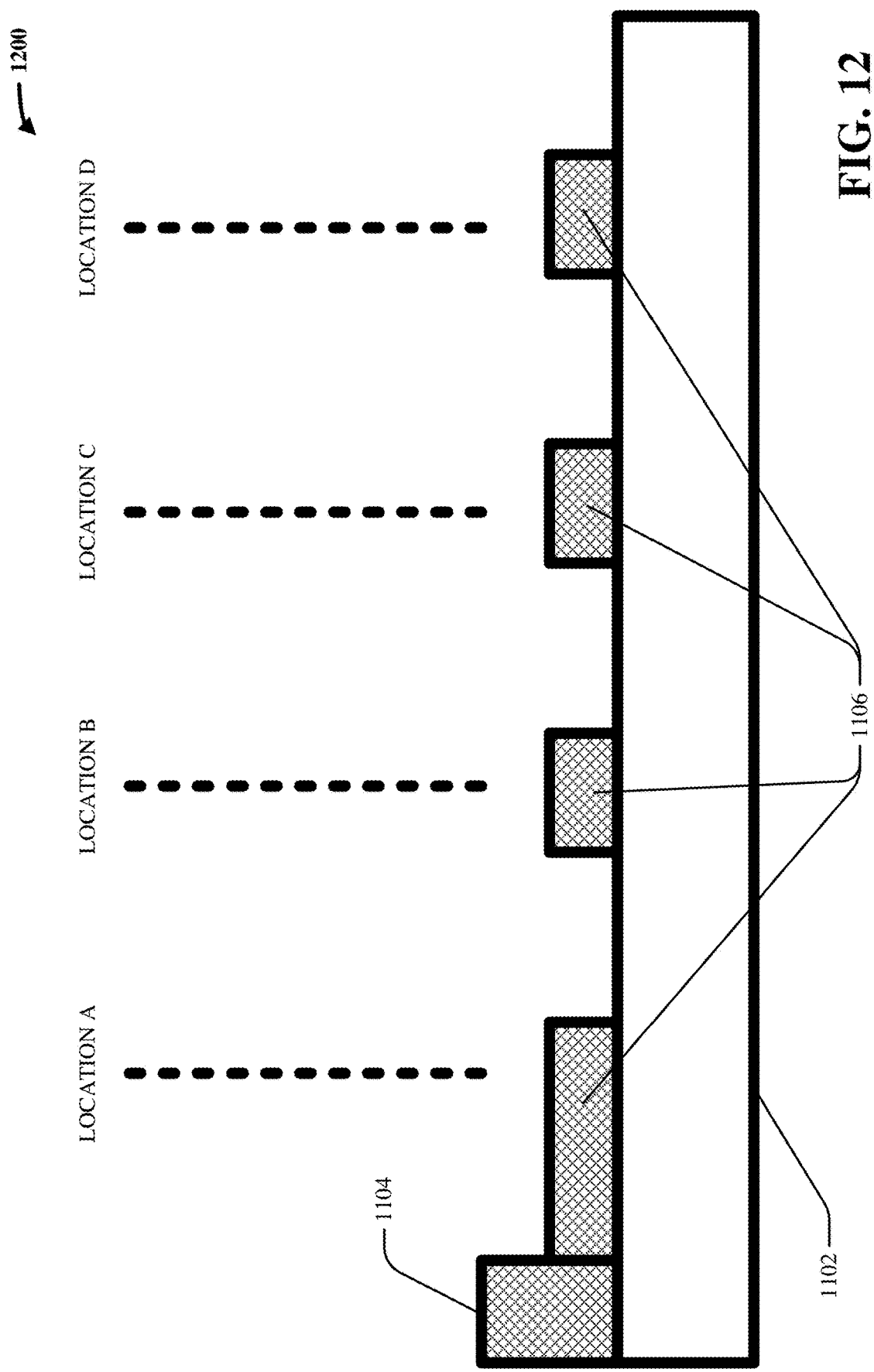

FIG. 12 illustrates a cross-sectional view 1200 of the quantum structure shown in FIG. 11, where the cross-sectional view 1200 is taken along axis 1108. As shown in the non-limiting example of FIG. 11, the spiraled superconducting wire 1106 can, in various cases, intersect with the axis 1108 in four locations. In various aspects, these four locations are labeled in FIG. 12: location A, location B, location C, and location D. In various other cases, however, the spiraled superconducting wire 1106 can be structured so as to intersect with the axis 1108 any suitable number of times (e.g., fewer than and/or more than four times).

Figure 13:
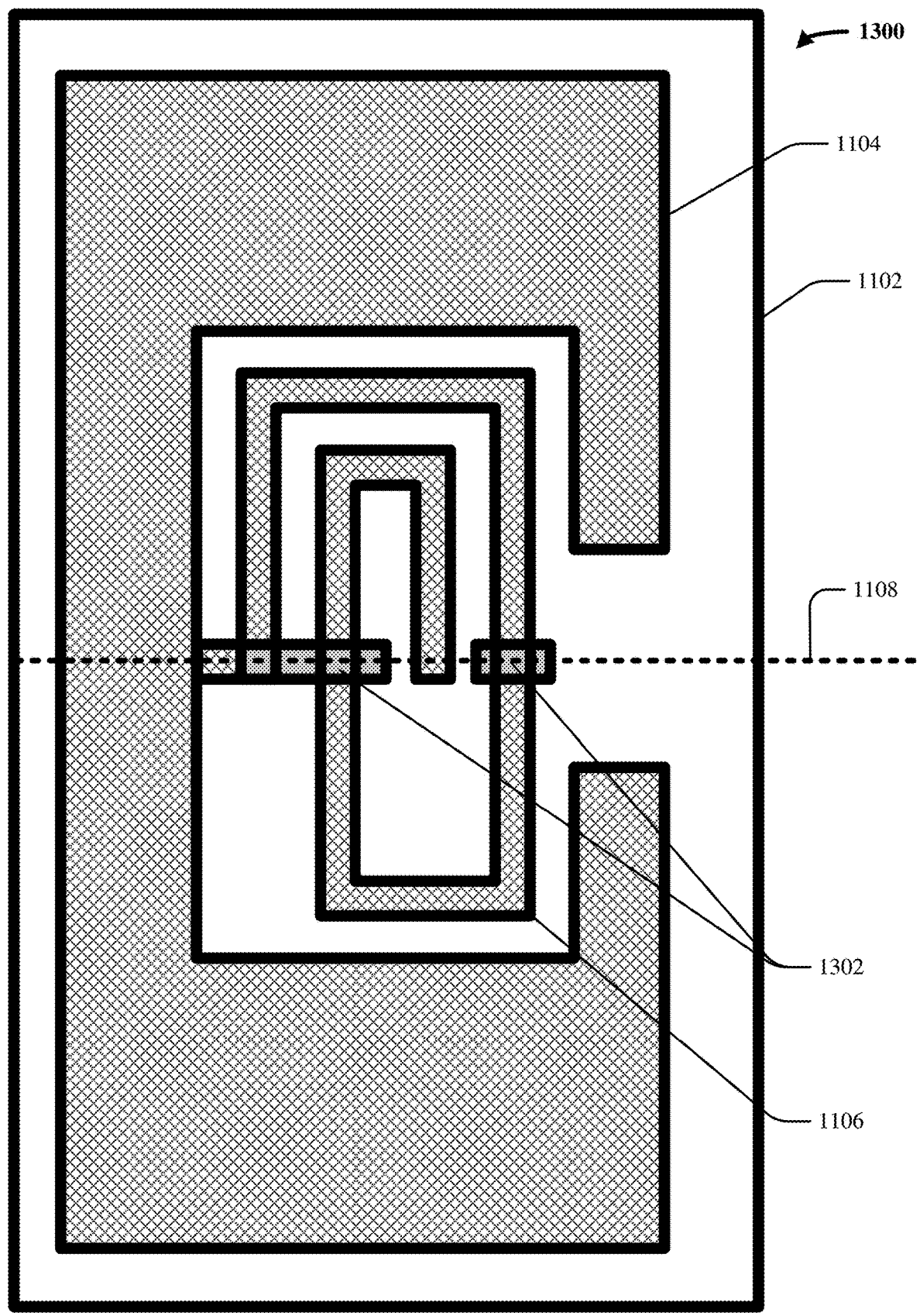

As shown in FIG. 13, in various embodiments, a dielectric layer 1302 can be deposited over some portions of the spiraled superconducting wire 1106. In various cases, the dielectric layer 1302 can have any suitable size, shape, dimensions, and/or can be comprised of any suitable dielectric material (e.g., poly silicon). In various cases, the dielectric layer 1302 can be fabricated via any suitable microfabrication and/or nanofabrication technique. In various instances, the dielectric layer 1302 can be deposited along the axis 1108 such that the dielectric layer 1302 covers all but one of the four locations at which the spiraled superconducting wire 1106 intersects the axis 1108.

Figure 14:
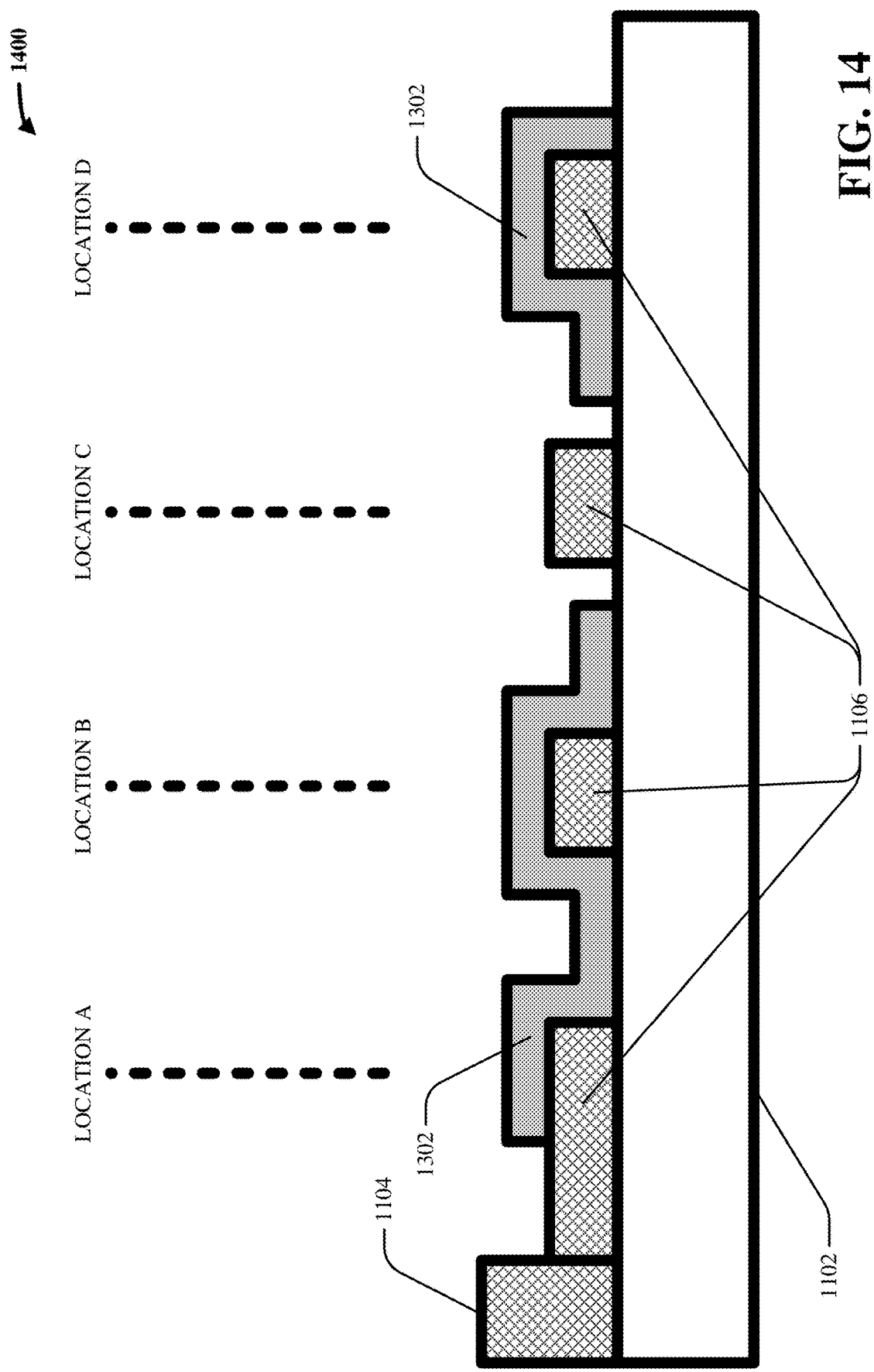

FIG. 14 illustrates a cross-sectional view 1400 of the quantum structure shown in FIG. 13, where the cross-sectional view 1400 is taken along axis 1108. In the non-limiting example shown in FIGS. 13-14, the location A, the location B, and the location D are covered by the dielectric layer 1302, while the location C is not covered by the dielectric layer 1302. This is a mere non-limiting example. In various other cases, the location C can be covered by the dielectric layer 1302, and any other location at which the spiraled superconducting wire 1106 intersects the axis 1108 can be left uncovered by the dielectric layer 1302.

Figure 15:
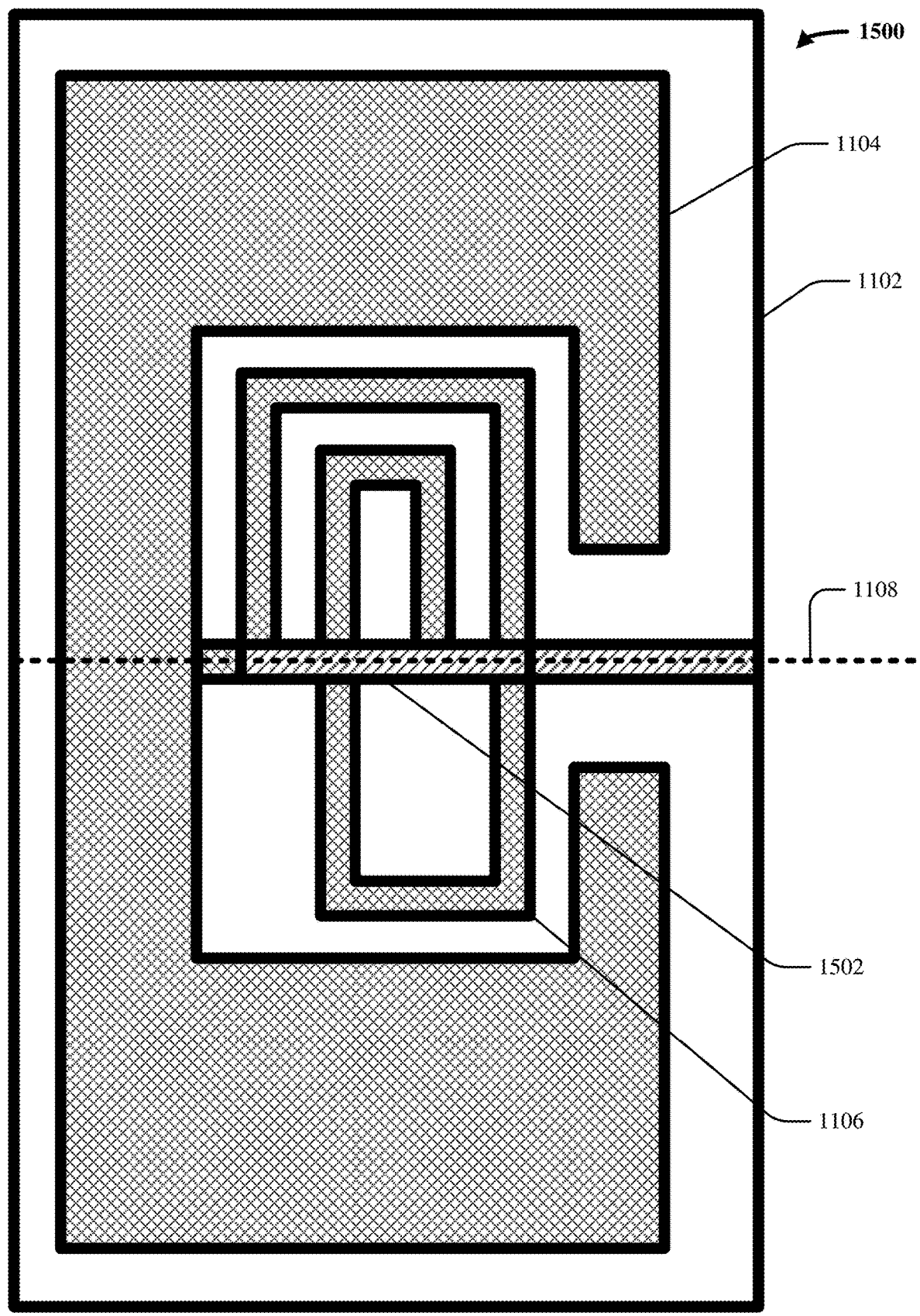

As shown in FIG. 15, in various embodiments, a top superconducting layer 1502 can be deposited over the dielectric layer 1302 and/or over the portion of the spiraled superconducting wire 1106 that intersects the axis 1108 but that is not covered by the dielectric layer 1302. In various cases, the top superconducting layer 1502 can have any suitable size, shape, dimensions, and/or can be comprised of any suitable superconducting material (e.g., aluminum). In various cases, the top superconducting layer 1502 can be fabricated via any suitable microfabrication and/or nanofabrication technique. As shown in the non-limiting example of FIG. 15, in various instances, the top superconducting layer 1502 can be deposited along the axis 1108 such that the top superconducting layer 1502 covers the dielectric layer 1302 as well as the previously-uncovered portion of the spiraled superconducting wire 1106 that intersects the axis 1108.

Figure 16:
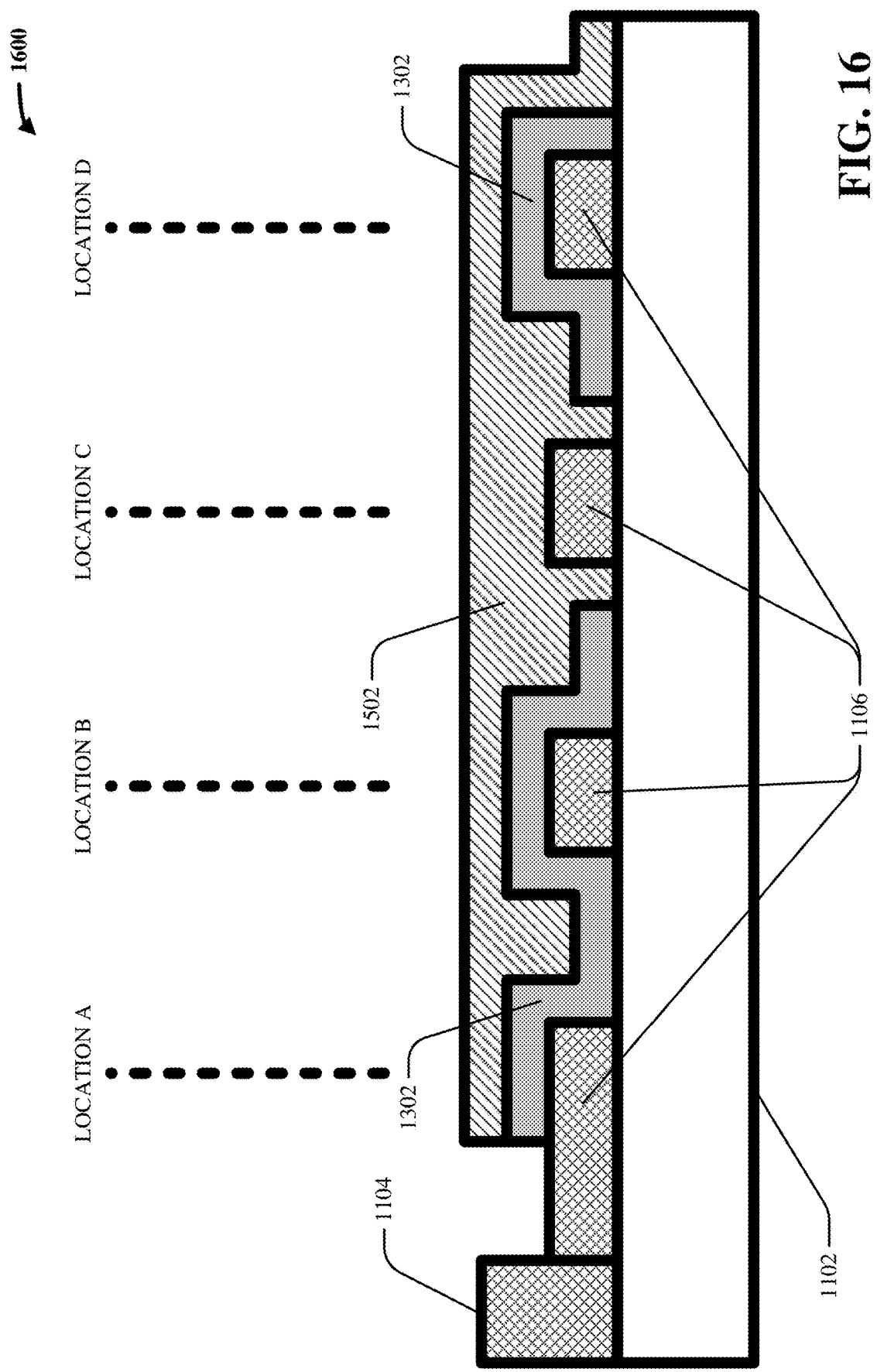

FIG. 16 illustrates a cross-sectional view 1600 of the quantum structure shown in FIG. 15, where the cross-sectional view 1600 is taken along axis 1108. As shown, the top superconducting layer 1502 can be deposited over location A, location B, location C, and location D. Accordingly, this can cause the top superconducting layer 1502 to be in direct contact with the spiraled superconducting wire 1106 at location C, and can cause the top superconducting layer 1502 to be not in direct contact with the spiraled superconducting wire 1106 at location A, location B, and location D. In other words, as shown in FIGS. 15-16, there exists a single conductive path (e.g., through location C) from the top superconducting layer 1502 to the spiraled superconducting wire 1106, and ultimately to the planar capacitor pad 1104.

In various cases, the structure collectively formed by the spiraled superconducting wire 1106, the dielectric layer 1302, and the top superconducting layer 1502 can be considered as a stepwise-trimmable inductor that includes three diffusion-based superconducting antifuses. Specifically, the sandwiched structures (e.g., 1502 on top of 1302 on top of 1106) at location A, location B, and location D can function as diffused-based superconducting antifuses. This is explained with respect to FIGS. 17a-19b.

Figure 17A:
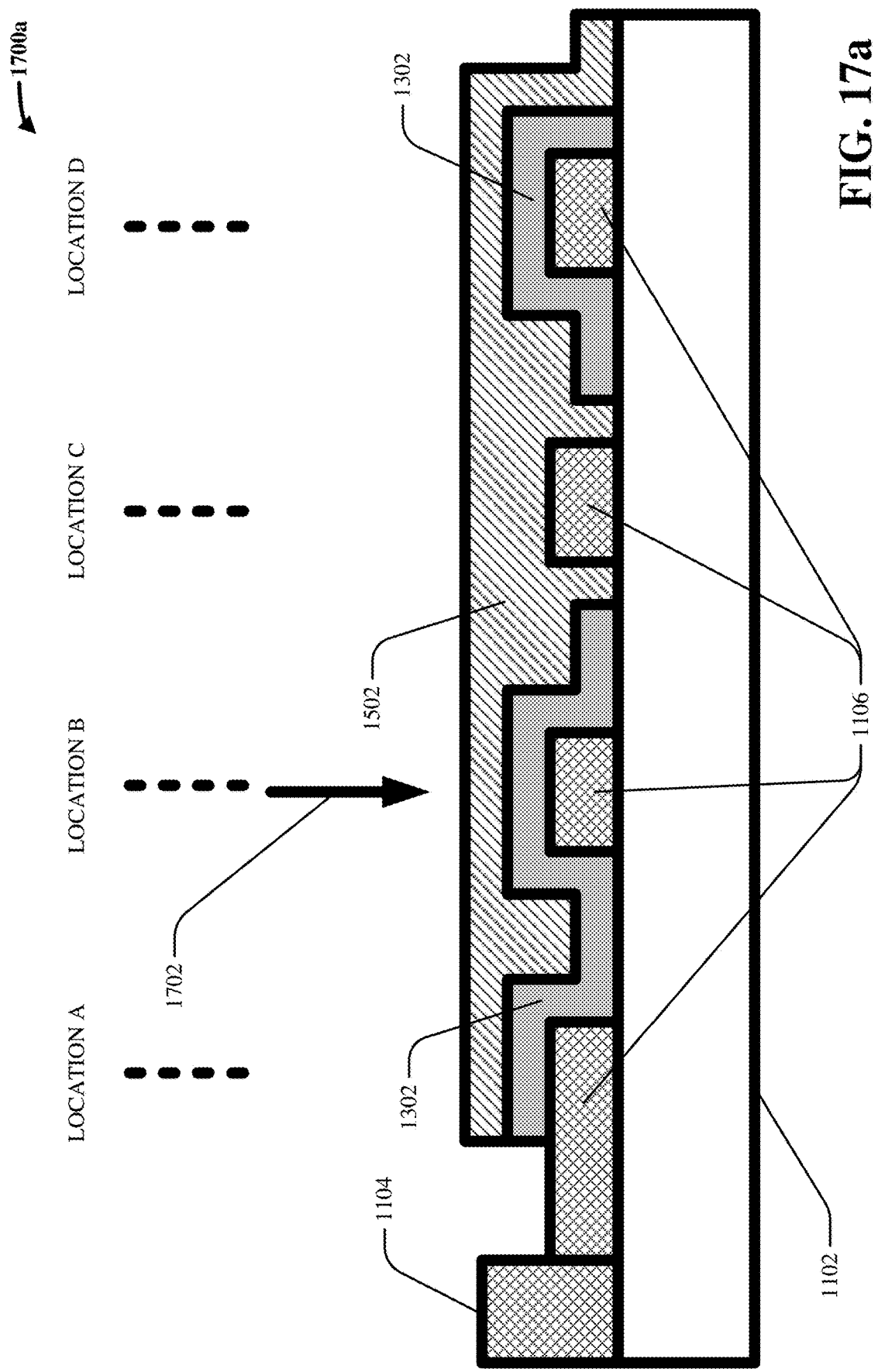
Figure 17B:
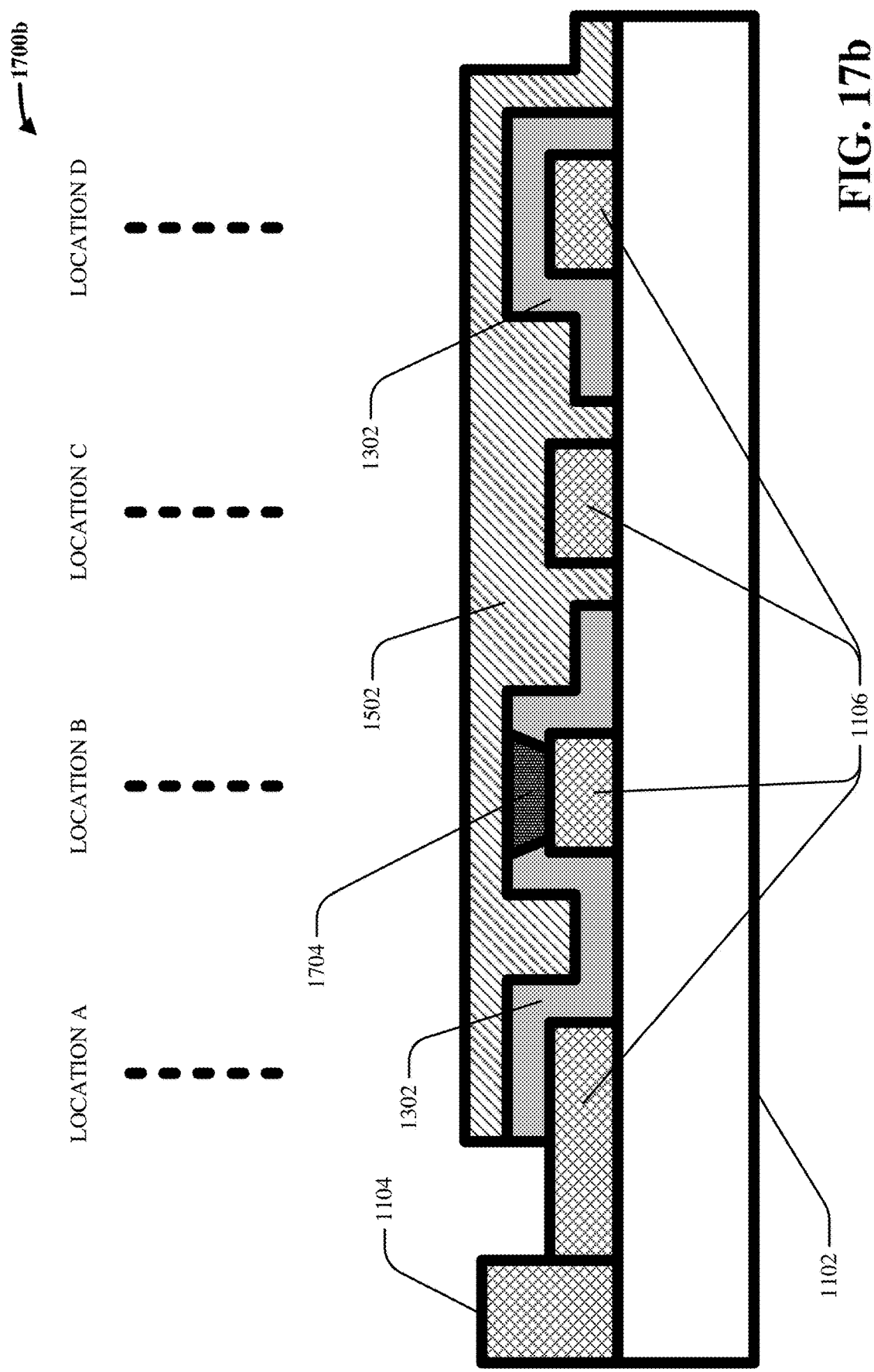

As shown in FIG. 17a, a laser 1702 can be aimed at the location B. In various cases, the laser 1702 can cause the sandwiched structure at the location B to heat up. When the location B heats to a sufficiently high temperature, some of the top superconducting layer 1502 can diffuse into the dielectric layer 1302 at the location B. For example, aluminum can diffuse into silicon at temperatures greater than or equal to 500 degrees Celsius. Accordingly, if the top superconducting layer 1502 is comprised of aluminum and if the dielectric layer 1302 is comprised of silicon, the laser 1702 can result in the formation of a diffused portion 1704 in the dielectric layer 1302 at the location B, as shown in FIG. 17b. This diffused portion 1704 can facilitate the flow of electric current. In other words, because of the diffused portion 1704, the top superconducting layer 1502 and the spiraled superconducting wire 1106 can be in electrical contact at the location B. In still other words, the laser 1702 can be considered as causing the location B to switch from a non-superconducting state (e.g., an electrically-open state) to a superconducting state (e.g., an electrically-closed state).

Now, there can be two conductive paths in parallel from the top superconducting layer 1502 to the spiraled superconducting wire 1106 (and thus to the planar capacitor pad 1104): a first path through the location C and a second path through the location B. As explained above, this can cause an inductance associated with the stepwise-trimmable inductor (e.g., collectively 1106, 1302, and 1502) to be decreased (e.g., adding inductors in parallel decreases overall/equivalent inductance) as compared to the inductance of the stepwise-trimmable inductor shown in FIGS. 15-17.

Figure 18A:
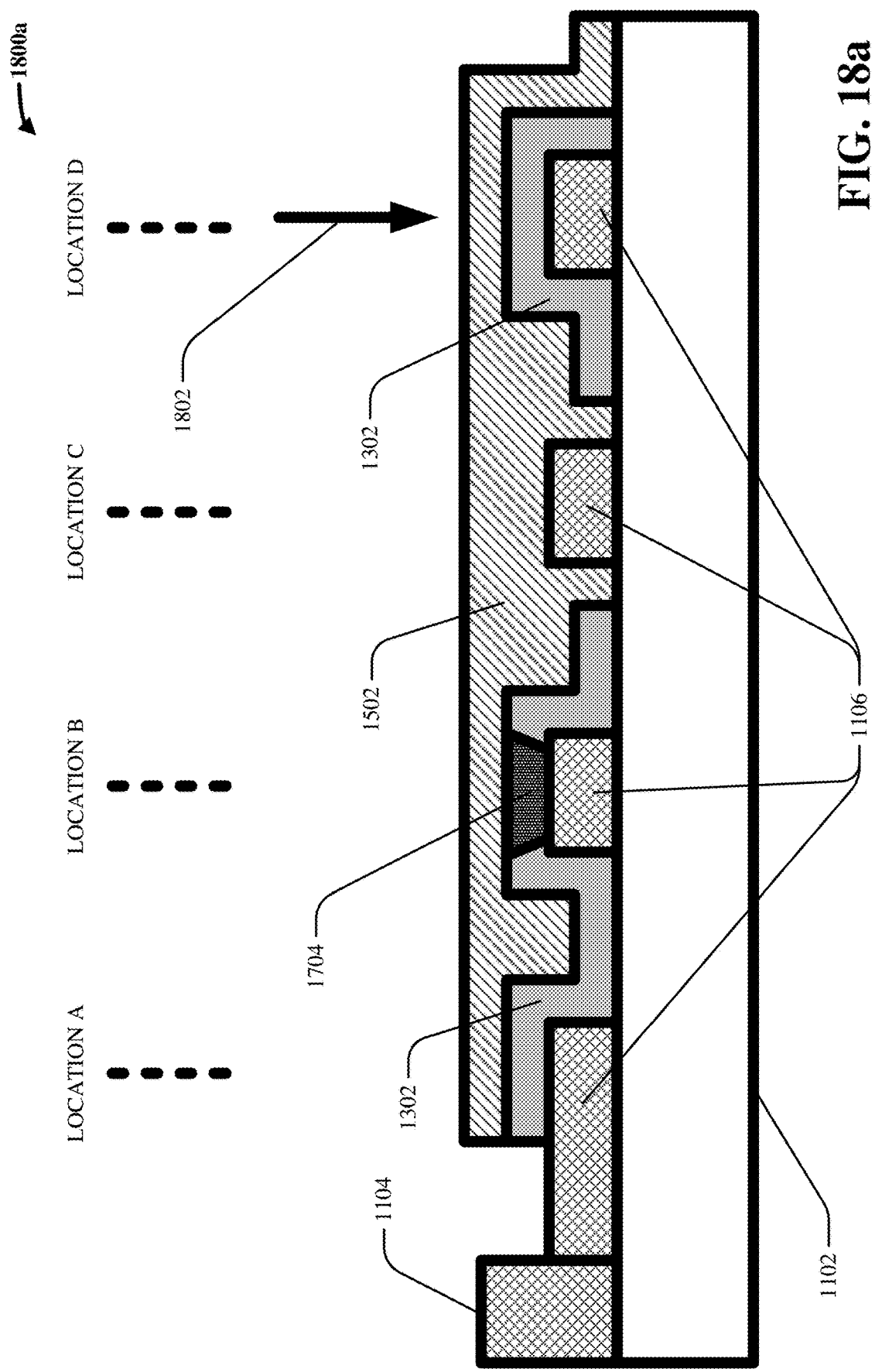
Figure 18B:
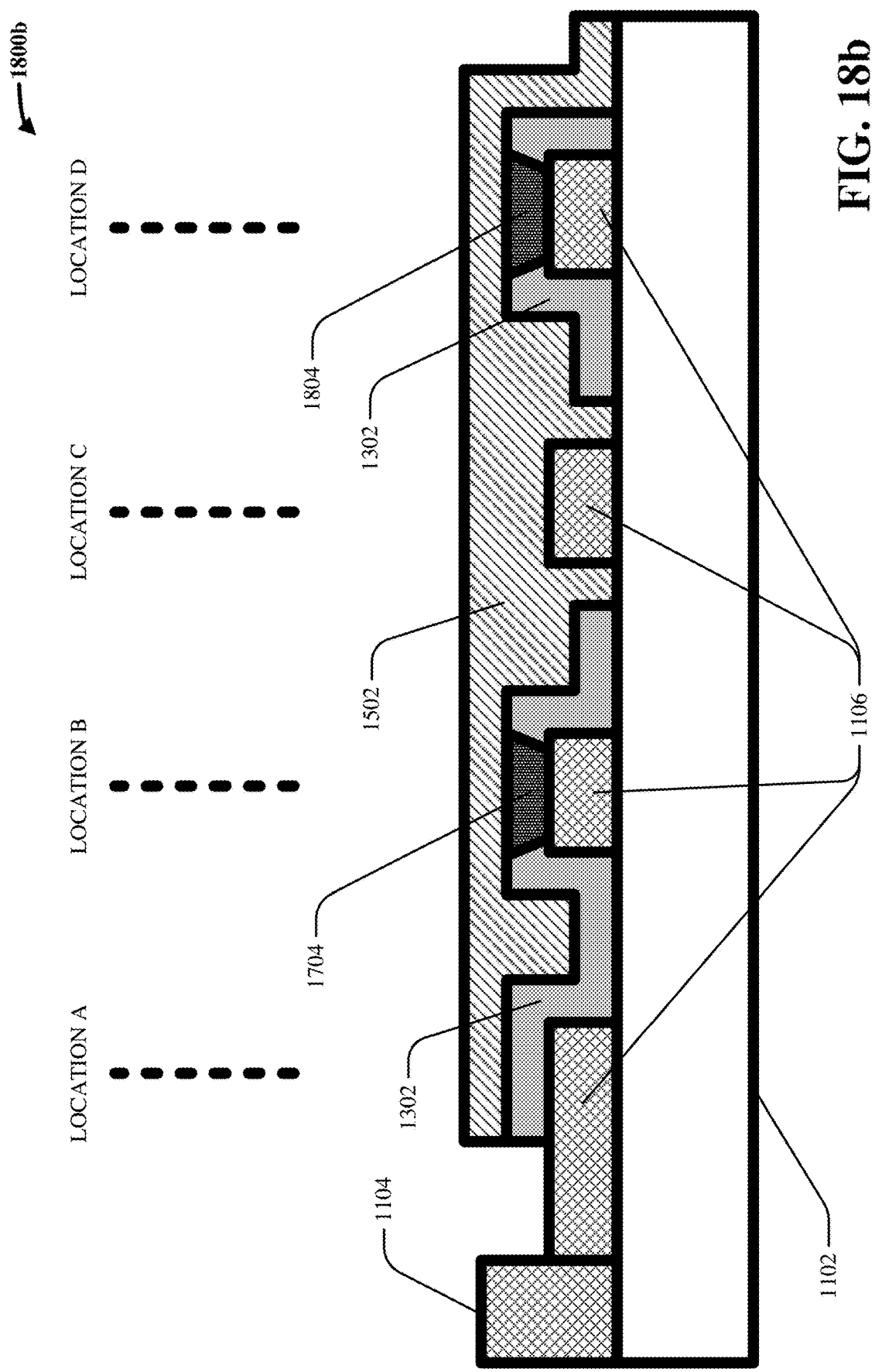

FIGS. 18a-18b are analogous to FIGS. 17a-17b, and they show how the inductance of the stepwise-trimmable inductor (e.g., collectively 1106, 1302, 1502) can be further decreased by a discrete amount via aiming a laser 1802 at the location D. Just as explained above, the laser 1802 can result in the formation of a diffused portion 1804 at the location D, which can cause the top superconducting layer 1502 and the spiraled superconducting wire 1106 to be in electrical contact at the location D. Now, there can be three conductive paths in parallel from the top superconducting layer 1502 to the spiraled superconducting wire 1106 (and thus to the planar capacitor pad 1104): a first path through the location C, a second path through the location B, and a third path through the location D. As explained above, this can cause an inductance associated with the stepwise-trimmable inductor (e.g., collectively 1106, 1302, and 1502) to be decreased as compared to the inductance of the stepwise-trimmable capacitor as shown in FIG. 17b.

Figure 19B:
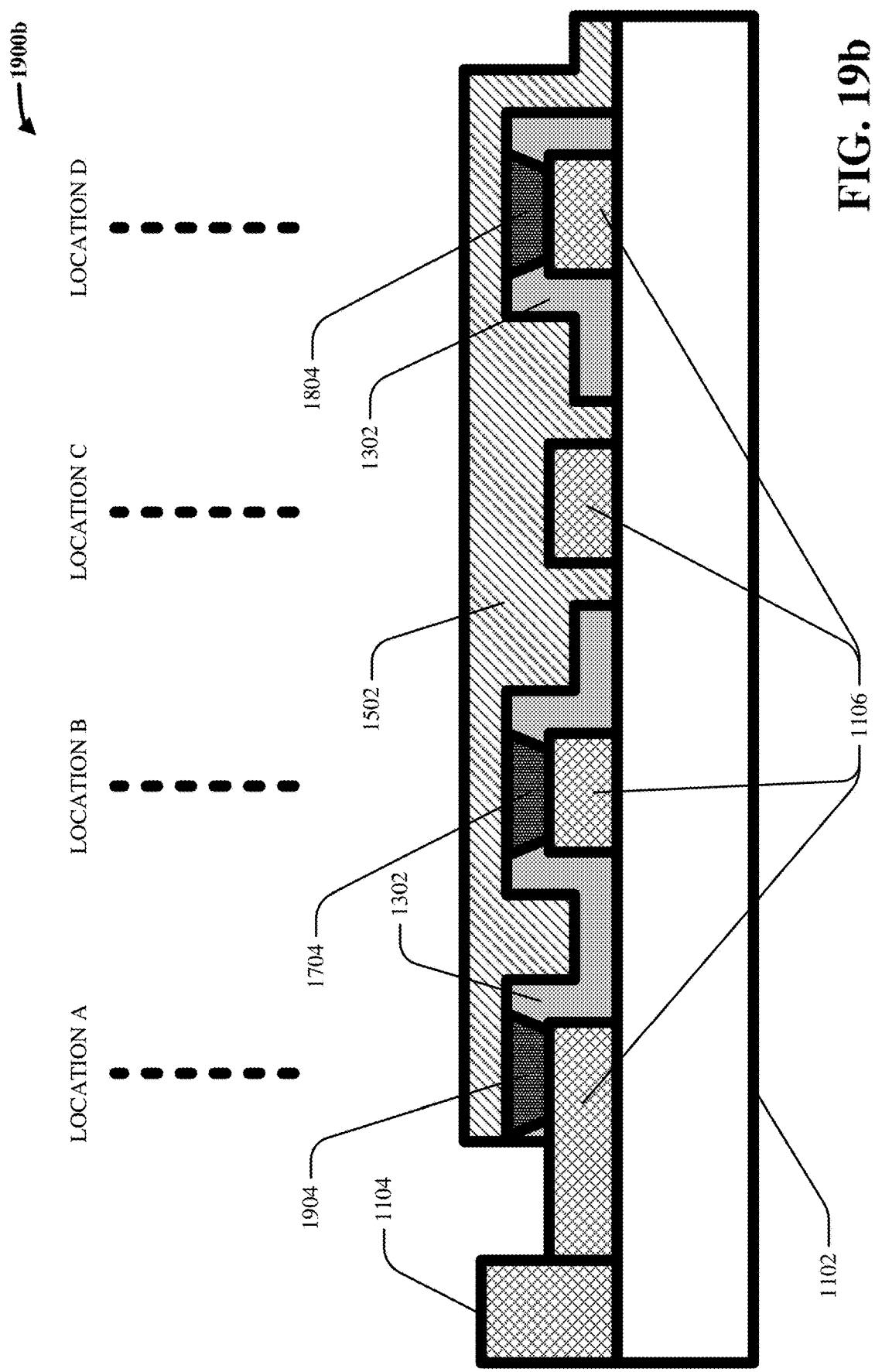
Figure 20:
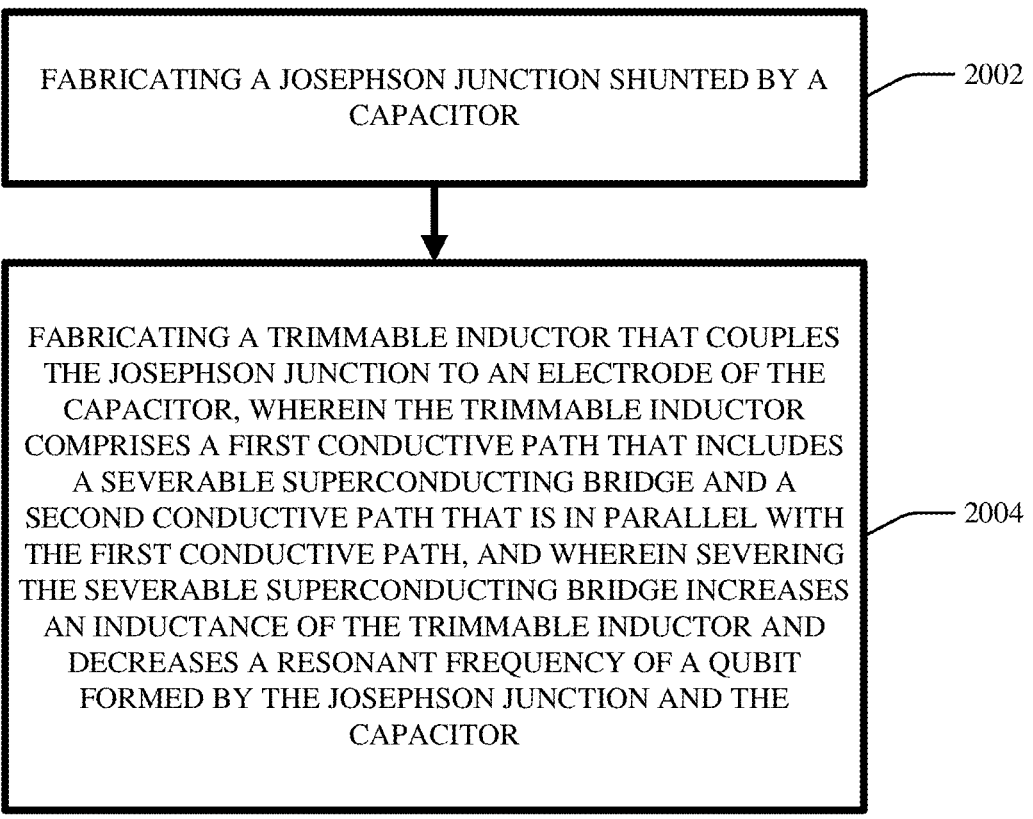
FIGS. 20-23 illustrate flow diagrams of example, non-limiting manufacturing and/or fabrication processes that facilitate trimmable inductors for qubit frequency tuning in accordance with one or more embodiments described herein.
Figure 21:
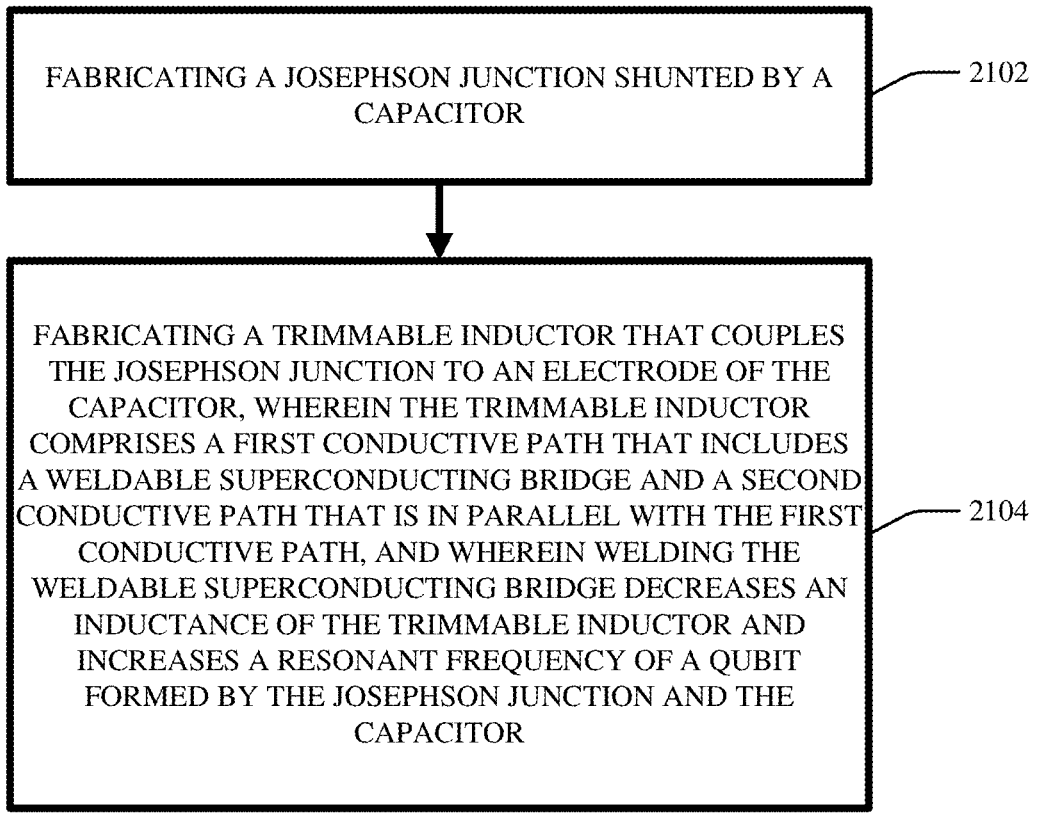
Figure 22:
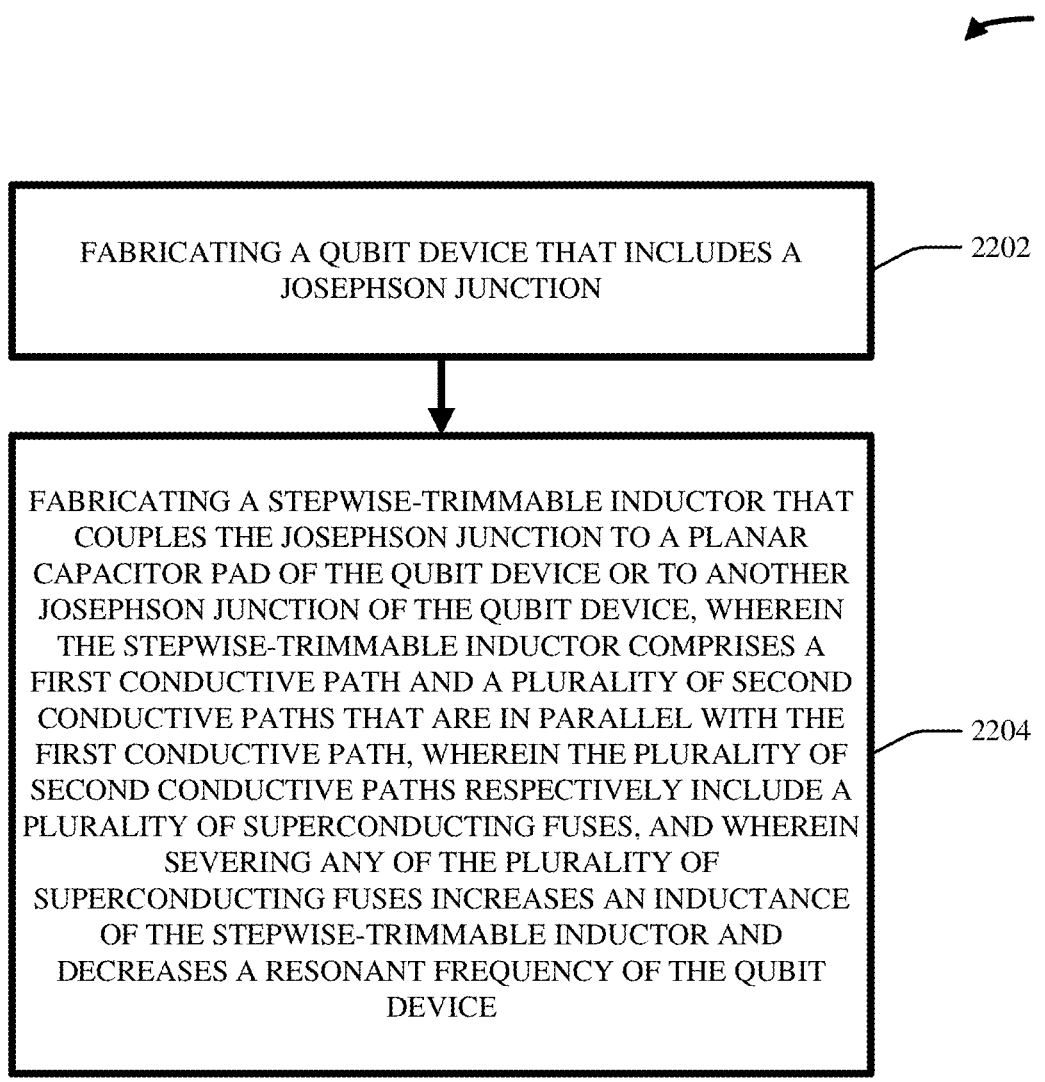
Figure 23:
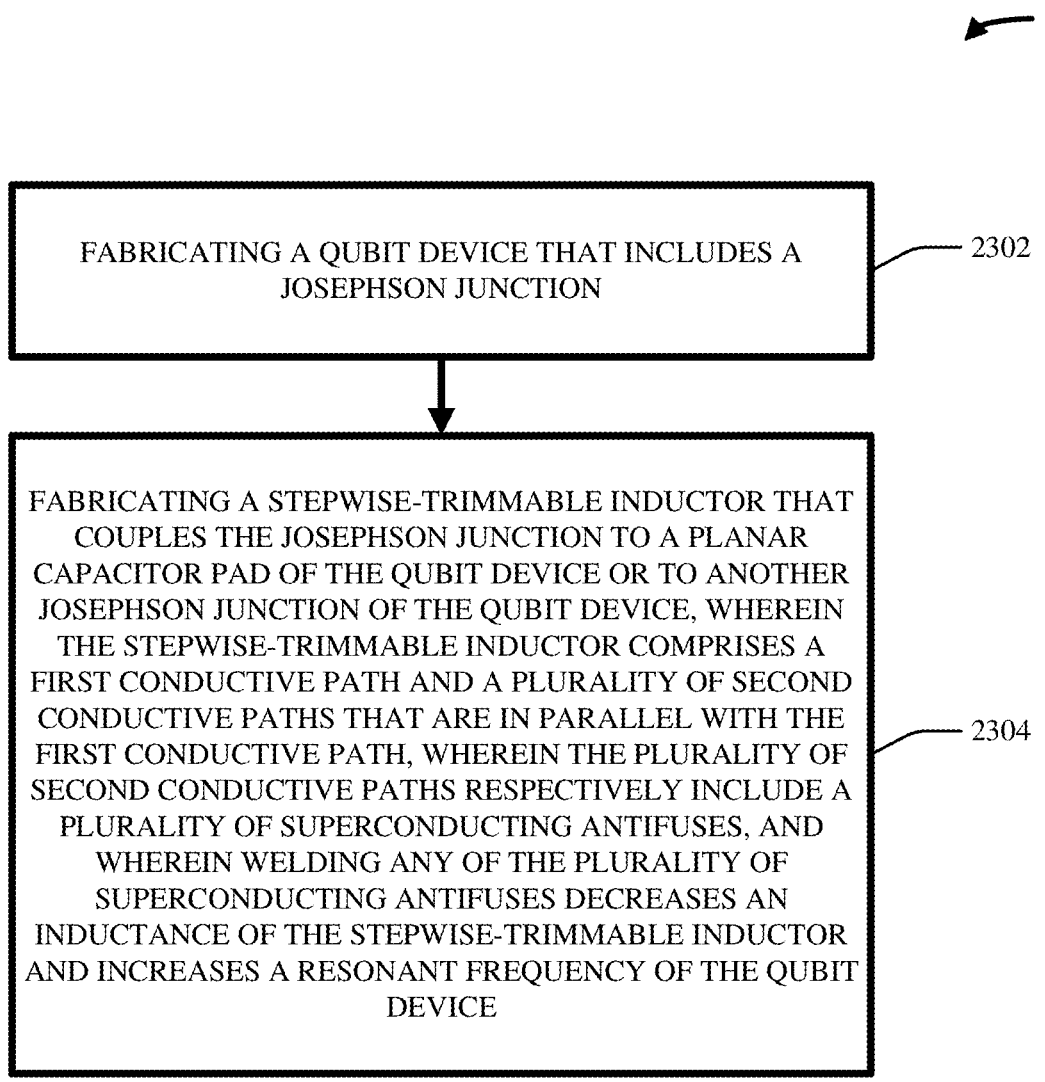

FIGS. 19a-19b are analogous to FIGS. 18a-18b, and they show how the inductance of the stepwise-trimmable inductor (e.g., collectively 1106, 1302, 1502) can be further decreased by a discrete amount via aiming a laser 1902 at the location A. Just as explained above, the laser 1902 can result in the formation of a diffused portion 1904 at the location A, which can cause the top superconducting layer 1502 and the spiraled superconducting wire 1106 to be in electrical contact at the location A. Now, there can be four conductive paths in parallel from the top superconducting layer 1502 to the spiraled superconducting wire 1106 (and thus to the planar capacitor pad 1104): a first path through the location C, a second path through the location B, a third path through the location D, and a fourth path through the location A. As explained above, this can cause an inductance associated with the stepwise-trimmable inductor (e.g., collectively 1106, 1302, and 1502) to be even further decreased as compared to the inductance of the stepwise-trimmable inductor as shown in FIG. 18b.

Although the herein disclosure discusses various example and non-limiting embodiments of the invention as applied to transmon qubits (e.g., a Josephson junction shunted by a planar capacitor comprising two pads), various embodiments of the invention can be applied to any suitable superconducting qubit whose construction includes capacitive pads and/or Josephson junctions. In other words, a superconducting qubit which can be tuned according to various embodiments of the invention can include one or more Josephson junctions and one or more capacitor pads arranged in any suitable fashion (e.g., regardless of the particular number, arrangement, and/or construction of the Josephson junctions and the capacitor pads of a given superconducting qubit, a Josephson junction can be coupled to a capacitor pad and/or to another Josephson junction via a trimmable inductor as described herein, where such trimmable inductor can be easily altered in order to facilitate resonant frequency tuning of the superconducting qubit).

Although the herein disclosure mainly discusses embodiments in which only one trimmable inductor is added to a superconducting qubit, it should be appreciated that this is a mere non-limiting example. In various aspects, any suitable number of trimmable inductors can be incorporated into a superconducting qubit.

In superconducting quantum computing systems, systems and/or techniques that can facilitate post-fabrication resonant frequency tuning can be desirable. Various embodiments of the invention can address this problem. In some embodiments, a superconducting qubit can include a planar capacitor and a Josephson junction. In various cases, a trimmable inductor can provide one or more conductive paths between the Josephson junction and a pad of the planar capacitor. In other embodiments, a superconducting qubit can include two Josephson junctions. In various cases, a trimmable inductor can provide one or more conductive paths between the two Josephson junctions (e.g., the trimmable inductor can chain together a plurality of Josephson junctions). In any case, the trimmable inductor can comprise at least a first conductive path that includes a severable and/or weldable superconducting bridge and at least a second conductive path that is in parallel with the first conductive path. When the superconducting bridge is severed and/or welded (as applicable), an inductance of the trimmable inductor can be altered, and the resonant frequency of the superconducting qubit can correspondingly change.

In various aspects, embodiments of the invention can enable resonant frequency tuning in post-fabrication environments without negatively/adversely affecting the performance/efficacy of the superconducting qubits (e.g., without requiring debonding and/or de-packaging, without deteriorating coherence times).

In various embodiments, a trimmable inductor as described herein can be fabricated from any suitable superconducting materials that have sufficiently high kinetic inductances. In various cases, a superconducting material can be considered to have a sufficiently high kinetic inductance if the ratio of the kinetic inductance to the geometric inductance of that superconducting material is greater than 1. In various cases, some non-limiting examples of such a superconducting material can include niobium nitride and/or niobium titanium nitride. In various instances, when the conductive paths of a trimmable inductor are constructed from superconducting materials having sufficiently high kinetic inductances, severing and/or welding of superconducting bridges of the trimmable inductor can cause greater changes in inductance (and thus greater changes in resonant frequency) as compared to a comparably-sized trimmable inductor whose conductive paths are constructed from superconducting materials having low kinetic inductances. Conversely, when the conductive paths of a trimmable inductor are constructed from superconducting materials having sufficiently high kinetic inductances, severing and/or welding of superconducting bridges of the trimmable inductor can cause comparable changes in inductance (and thus comparable changes in resonant frequency) as compared to a larger (e.g., more coiled, more spiraled, more meandering) trimmable inductor whose conductive paths are constructed from superconducting materials having low kinetic inductances.

In various embodiments, high inductances can also be achieved by having a series array of Josephson junctions. In such cases, the meandered, coiled, and/or spiraled wires depicted in the figures can be replaced by (and/or in some cases supplemented with) a chain of Josephson junctions, thereby creating a linear superinductance.

FIGS. 20-23 illustrate flow diagrams of example, non-limiting manufacturing and/or fabrication processes 2000-2300 that can facilitate trimmable inductors for qubit frequency tuning in accordance with one or more embodiments described herein.

First, consider the manufacturing and/or fabrication process 2000. In various embodiments, act 2002 can include fabricating a Josephson junction (e.g., 104) shunted by a capacitor (e.g., collectively 106 and 108).

In various aspects, act 2004 can include fabricating a trimmable inductor (e.g., 110) that couples the Josephson junction to a pad (e.g., 108) of the capacitor. In various instances, the trimmable inductor can comprise a first conductive path (e.g., 112) that includes a severable superconducting bridge (e.g., 116) and a second conductive path (e.g., 114) that is in parallel with the first conductive path. In various cases, severing the severable superconducting bridge can increase an inductance of the trimmable inductor and can decrease a resonant frequency of a qubit formed by the Josephson junction and the capacitor.

Next, consider the manufacturing and/or fabrication process 2100. In various embodiments, act 2102 can include fabricating a Josephson junction (e.g., 104) shunted by a capacitor (e.g., collectively 106 and 108).

In various aspects, act 2104 can include fabricating a trimmable inductor (e.g., 110) that couples the Josephson junction to a pad (e.g., 108) of the capacitor. In various instances, the trimmable inductor can comprise a first conductive path (e.g., 112) that includes a weldable superconducting bridge (e.g., 116) and a second conductive path (e.g., 114) that is in parallel with the first conductive path. In various cases, welding the weldable superconducting bridge can decrease an inductance of the trimmable inductor and can increase a resonant frequency of a qubit formed by the Josephson junction and the capacitor.

Now, consider the manufacturing and/or fabrication process 2200. In various embodiments, act 2202 can include fabricating a qubit device (e.g., collectively 104, 106, and 108) that includes a Josephson junction (e.g., 104).

In various aspects, act 2204 can include fabricating a stepwise-trimmable inductor (e.g., 110 as shown in FIG. 8) that couples the Josephson junction to a planar capacitor pad (e.g., 108) of the qubit device or to another Josephson junction of the qubit device. In various instances, the stepwise-trimmable inductor can comprise a first conductive path and a plurality of second conductive paths (e.g., as shown/explained with respect to FIGS. 8-9) that are in parallel with the first conductive path. In various aspects, the plurality of second conductive paths can respectively include a plurality of superconducting fuses (e.g., 116, 902, 804, 806). In various cases, severing any of the plurality of superconducting fuses can increase an inductance of the stepwise-trimmable inductor and can decrease a resonant frequency of the qubit device.

Finally, consider the manufacturing and/or fabrication process 2300. In various embodiments, act 2302 can include fabricating a qubit device (e.g., collectively 104, 106, and 108) that includes a Josephson junction (e.g., 104).

In various aspects, act 2304 can include fabricating a stepwise-trimmable inductor (e.g., 110 as shown in FIG. 8) that couples the Josephson junction to a planar capacitor pad (e.g., 108) of the qubit device or to another Josephson junction of the qubit device. In various instances, the stepwise-trimmable inductor can comprise a first conductive path and a plurality of second conductive paths (e.g., as shown/explained with respect to FIGS. 8-9) that are in parallel with the first conductive path. In various aspects, the plurality of second conductive paths can respectively include a plurality of superconducting antifuses (e.g., 116, 802, 804, 806; and/or location A, location B, and location D of FIG. 16). In various cases, welding any of the plurality of superconducting antifuses can decrease an inductance of the stepwise-trimmable inductor and can increase a resonant frequency of the qubit device.

Figure 24:
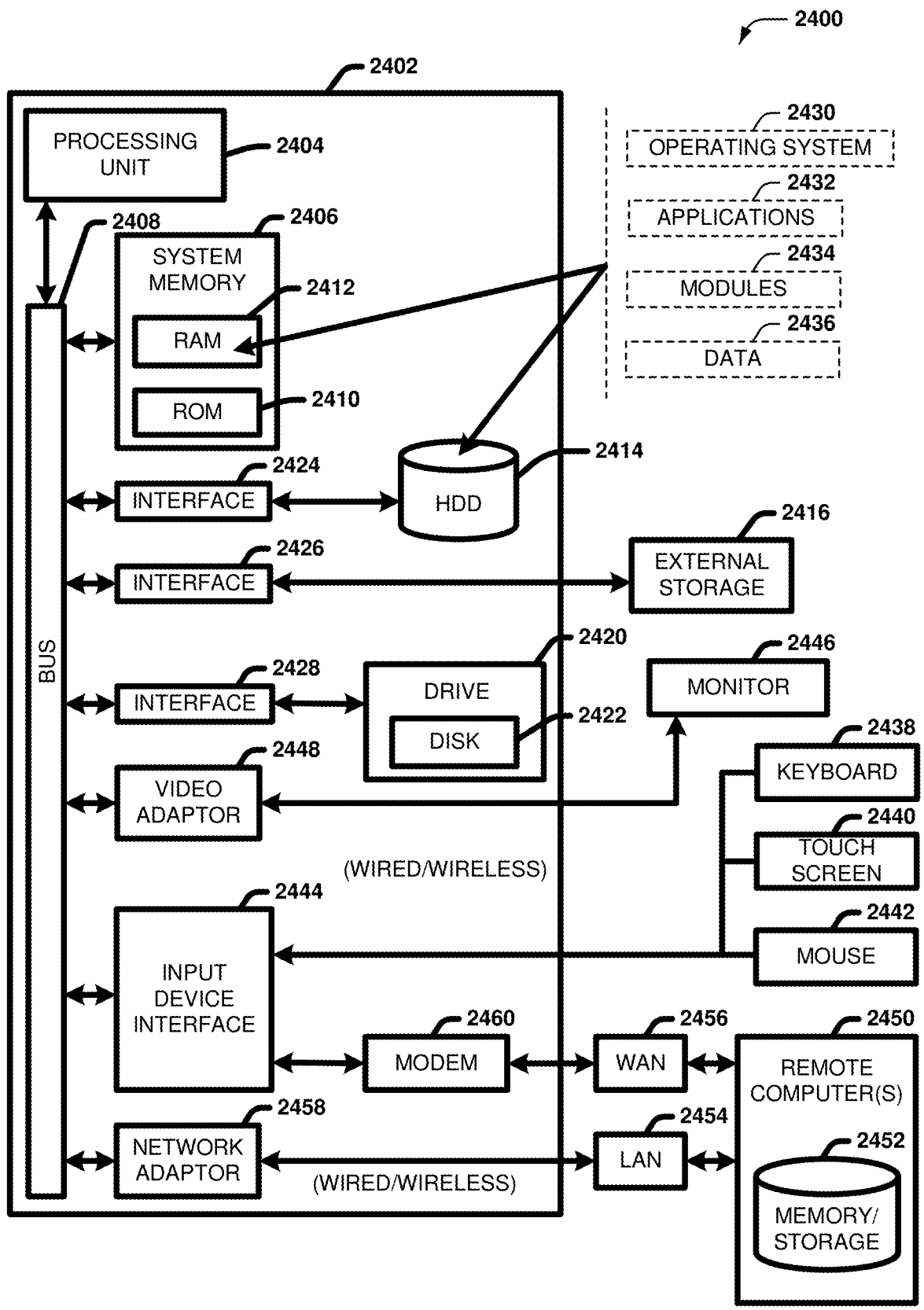
FIG. 24 illustrates a block diagram of an example, non-limiting operating environment in which one or more embodiments described herein can be facilitated.

In order to provide additional context for various embodiments described herein, FIG. 24 and the following discussion are intended to provide a brief, general description of a suitable computing environment 2400 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 24, the example environment 2400 for implementing various embodiments of the aspects described herein includes a computer 2402, the computer 2402 including a processing unit 2404, a system memory 2406 and a system bus 2408. The system bus 2408 couples system components including, but not limited to, the system memory 2406 to the processing unit 2404. The processing unit 2404 can be any of various commercially available processors. Dual microprocessors and other multi processor architectures can also be employed as the processing unit 2404.

The system bus 2408 can be any of several types of bus structure that can further interconnect to a memory bus (with or without a memory controller), a peripheral bus, and a local bus using any of a variety of commercially available bus architectures. The system memory 2406 includes ROM 2410 and RAM 2412. A basic input/output system (BIOS) can be stored in a non-volatile memory such as ROM, erasable programmable read only memory (EPROM), EEPROM, which BIOS contains the basic routines that help to transfer information between elements within the computer 2402, such as during startup. The RAM 2412 can also include a high-speed RAM such as static RAM for caching data.

The computer 2402 further includes an internal hard disk drive (HDD) 2414 (e.g., EIDE, SATA), one or more external storage devices 2416 (e.g., a magnetic floppy disk drive (FDD) 2416, a memory stick or flash drive reader, a memory card reader, etc.) and a drive 2420, e.g., such as a solid state drive, an optical disk drive, which can read or write from a disk 2422, such as a CD-ROM disc, a DVD, a BD, etc. Alternatively, where a solid state drive is involved, disk 2422 would not be included, unless separate. While the internal HDD 2414 is illustrated as located within the computer 2402, the internal HDD 2414 can also be configured for external use in a suitable chassis (not shown). Additionally, while not shown in environment 2400, a solid state drive (SSD) could be used in addition to, or in place of, an HDD 2414. The HDD 2414, external storage device(s) 2416 and drive 2420 can be connected to the system bus 2408 by an HDD interface 2424, an external storage interface 2426 and a drive interface 2428, respectively. The interface 2424 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 2402, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 2412, including an operating system 2430, one or more application programs 2432, other program modules 2434 and program data 2436. All or portions of the operating system, applications, modules, and/or data can also be cached in the RAM 2412. The systems and methods described herein can be implemented utilizing various commercially available operating systems or combinations of operating systems.

Computer 2402 can optionally comprise emulation technologies. For example, a hypervisor (not shown) or other intermediary can emulate a hardware environment for operating system 2430, and the emulated hardware can optionally be different from the hardware illustrated in FIG. 24. In such an embodiment, operating system 2430 can comprise one virtual machine (VM) of multiple VMs hosted at computer 2402. Furthermore, operating system 2430 can provide runtime environments, such as the Java runtime environment or the .NET framework, for applications 2432. Runtime environments are consistent execution environments that allow applications 2432 to run on any operating system that includes the runtime environment. Similarly, operating system 2430 can support containers, and applications 2432 can be in the form of containers, which are lightweight, standalone, executable packages of software that include, e.g., code, runtime, system tools, system libraries and settings for an application.

Further, computer 2402 can be enable with a security module, such as a trusted processing module (TPM). For instance with a TPM, boot components hash next in time boot components, and wait for a match of results to secured values, before loading a next boot component. This process can take place at any layer in the code execution stack of computer 2402, e.g., applied at the application execution level or at the operating system (OS) kernel level, thereby enabling security at any level of code execution.

A user can enter commands and information into the computer 2402 through one or more wired/wireless input devices, e.g., a keyboard 2438, a touch screen 2440, and a pointing device, such as a mouse 2442. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 2404 through an input device interface 2444 that can be coupled to the system bus 2408, but can be connected by other interfaces, such as a parallel port, an IEEE 1394 serial port, a game port, a USB port, an IR interface, a BLUETOOTH® interface, etc.

A monitor 2446 or other type of display device can be also connected to the system bus 2408 via an interface, such as a video adapter 2448. In addition to the monitor 2446, a computer typically includes other peripheral output devices (not shown), such as speakers, printers, etc.

The computer 2402 can operate in a networked environment using logical connections via wired and/or wireless communications to one or more remote computers, such as a remote computer(s) 2450. The remote computer(s) 2450 can be a workstation, a server computer, a router, a personal computer, portable computer, microprocessor-based entertainment appliance, a peer device or other common network node, and typically includes many or all of the elements described relative to the computer 2402, although, for purposes of brevity, only a memory/storage device 2452 is illustrated. The logical connections depicted include wired/wireless connectivity to a local area network (LAN) 2454 and/or larger networks, e.g., a wide area network (WAN) 2456. Such LAN and WAN networking environments are commonplace in offices and companies, and facilitate enterprise-wide computer networks, such as intranets, all of which can connect to a global communications network, e.g., the Internet.

When used in a LAN networking environment, the computer 2402 can be connected to the local network 2454 through a wired and/or wireless communication network interface or adapter 2458. The adapter 2458 can facilitate wired or wireless communication to the LAN 2454, which can also include a wireless access point (AP) disposed thereon for communicating with the adapter 2458 in a wireless mode.

When used in a WAN networking environment, the computer 2402 can include a modem 2460 or can be connected to a communications server on the WAN 2456 via other means for establishing communications over the WAN 2456, such as by way of the Internet. The modem 2460, which can be internal or external and a wired or wireless device, can be connected to the system bus 2408 via the input device interface 2444. In a networked environment, program modules depicted relative to the computer 2402 or portions thereof, can be stored in the remote memory/storage device 2452. It will be appreciated that the network connections shown are example and other means of establishing a communications link between the computers can be used.

When used in either a LAN or WAN networking environment, the computer 2402 can access cloud storage systems or other network-based storage systems in addition to, or in place of, external storage devices 2416 as described above, such as but not limited to a network virtual machine providing one or more aspects of storage or processing of information. Generally, a connection between the computer 2402 and a cloud storage system can be established over a LAN 2454 or WAN 2456 e.g., by the adapter 2458 or modem 2460, respectively. Upon connecting the computer 2402 to an associated cloud storage system, the external storage interface 2426 can, with the aid of the adapter 2458 and/or modem 2460, manage storage provided by the cloud storage system as it would other types of external storage. For instance, the external storage interface 2426 can be configured to provide access to cloud storage sources as if those sources were physically connected to the computer 2402.

The computer 2402 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adaptor card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible.

Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
   a Josephson junction shunted by a capacitor; and
   a trimmable inductor that couples the Josephson junction to a pad of the capacitor, wherein the trimmable inductor comprises a severable superconducting bridge, and wherein severing the severable superconducting bridge increases an inductance of the trimmable inductor and decreases a resonant frequency of a qubit formed by the Josephson junction and the capacitor.

2. The device of claim 1, wherein the trimmable inductor comprises a first conductive path and a second conductive path that is in parallel with the first conductive path, and wherein the first conductive path includes the severable superconducting bridge.

3. The device of claim 1, wherein the trimmable inductor is located externally of the pad of the capacitor.

4. The device of claim 1, wherein the trimmable inductor is located internally of the pad of the capacitor.

5. A method, comprising:
   fabricating a Josephson junction shunted by a capacitor; and
   fabricating a trimmable inductor that couples the Josephson junction to a pad of the capacitor, wherein the trimmable inductor comprises a severable superconducting bridge, and wherein severing the severable superconducting bridge increases an inductance of the trimmable inductor and decreases a resonant frequency of a qubit formed by the Josephson junction and the capacitor.

6. The method of claim 5, wherein the trimmable inductor comprises a first conductive path and a second conductive path that is in parallel with the first conductive path, and wherein the first conductive path includes the severable superconducting bridge.

7. The method of claim 5, wherein the trimmable inductor is located externally of the pad of the capacitor.

8. The method of claim 5, wherein the trimmable inductor is located internally of the pad of the capacitor.

* * * * *